United States Patent [19]

Morokawa et al.

[11] 4,441,826

[45] Apr. 10, 1984

[54] ELECTRONIC TIMEPIECE

[75] Inventors: Shigeru Morokawa, Tokyo; Keiichiro Koga, Tokorozawa, both of Japan

[73] Assignee: Citizen Watch Company Limited, Tokyo, Japan

[21] Appl. No.: 430,569

[22] Filed: Sep. 30, 1982

Related U.S. Application Data

[62] Division of Ser. No. 269,297, Jun. 1, 1981, abandoned, which is a division of Ser. No. 1,260, Jan. 5, 1979, Pat. No. 4,298,971.

[30] Foreign Application Priority Data

Jan. 11, 1978 [JP] Japan .................................. 53-1751

[51] Int. Cl.³ ......................... G04B 1/00; H03K 3/01; G05F 1/56

[52] U.S. Cl. .................................. 368/204; 307/297; 323/281

[58] Field of Search ........................ 368/66, 82, 85–87, 368/155–156, 159, 200, 202–204; 323/265, 268, 273, 280, 281, 277, 292, 303; 307/296 R, 297

[56] References Cited

U.S. PATENT DOCUMENTS

| | | | |
|---|---|---|---|
| 3,946,303 | 3/1976 | Streit et al. | 323/80 |
| 3,986,199 | 10/1976 | Williams | 368/204 |
| 4,094,137 | 6/1978 | Morokana | 368/204 |
| 4,095,164 | 6/1978 | Altmed | 323/280 |

*Primary Examiner*—Vit W. Miska

*Attorney, Agent, or Firm*—Jordan and Hamburg

[57] ABSTRACT

An electronic timepiece having voltage regulation, temperature detection and battery voltage detection means provided on the same integrated circuit as is used for timekeeping circuitry, and having external terminals for stepwise weighted adjustment of timekeeping gain/-loss.

3 Claims, 41 Drawing Figures

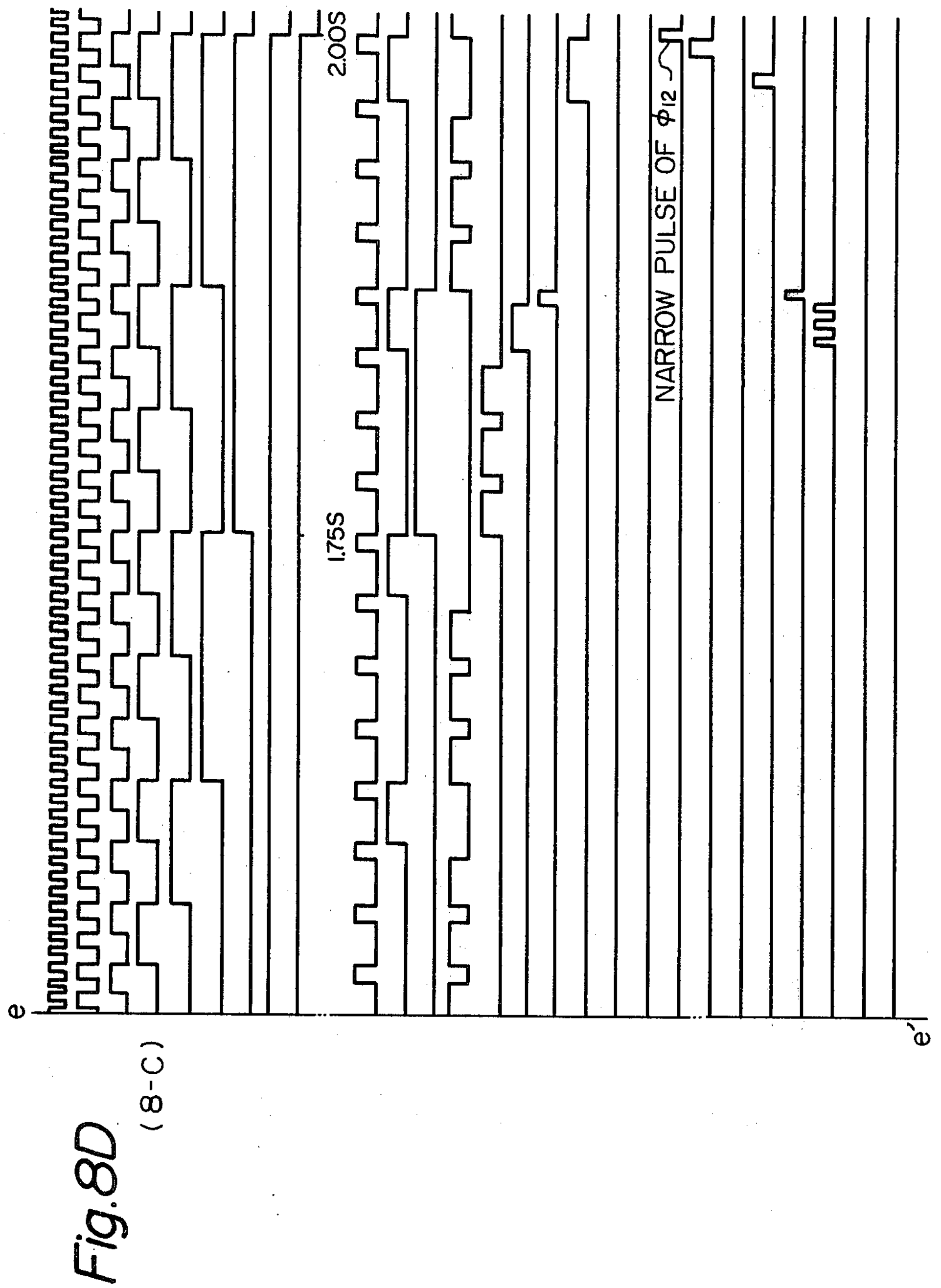
Fig.8D (8-C)

ELECTRONIC TIMEPIECE

This is a division of application Ser. No. 269,297, filed June 1, 1981, said Ser. No. 269,297, now abandoned, being a divisional application of U.S. patent application Ser. No. 1,260 filed Jan. 5, 1979, now U.S. Pat. No. 4,298,971 issued Nov. 3, 1981.

This invention relates to electronic timepieces, and in particular to electronic timepieces having voltage regulation and temperature compensation means provided upon the same integrated circuit chip as is used for the timekeeping and other circuitry.

An important problem in the design of electronic timepieces of high accuracy is that of compensating for variations in the frequency of the time standard oscillator circuit, caused by the effects of temperature variations upon the quartz crystal of that oscillator circuit. Various approaches have been adopted to this problem in the past, but the principal method used has been to provide a capacitor having a suitable temperature coefficient within the standard frequency oscillator circuit, to provide compensation. This solution has various disadvantages, such as the variation of the capacity with time, variations in temperature coefficient between different quartz crystals, and the fact that such a capacitor must normally be provided as an external component attached to the integrated circuit of the timepiece. Another problem which arises due to temperature variations is that the contrast of a liquid crystal display, in the case of a digital display type of electronic timepiece, is decreased as the ambient temperature falls, if the drive voltage applied to the display is held constant. It is therefore desirable to have some means of temperature detection which will provide some type of output signal which can be used for such purposes as increasing or decreasing the running rate of the timepiece and varying the drive voltage applied to a liquid crystal display, in such a way as to compensate for variations in the ambient operating temperature of the timepiece.

With an electronic timepiece in accordance with the present invention, such means of temperature detection can be easily and economically provided upon the same integrated circuit chip as is used for timekeeping and other purposes. A voltage regulator circuit can also be provided on the same integrated circuit, for supplying a voltage to the temperature detection circuit which is independent of variations in the voltage of the timepiece battery due to aging and temperature variations. The voltage regulator circuit can also provide supply voltages for parts of the timepiece circuit such as the initial stages of frequency division after the output from the standard frequency oscillator, thereby enabling such parts of the circuit to be supplied with a lower voltage than that of the timepiece battery. This enables substantial reductions to be obtained in the power consumption of the timepiece.

With an electronic timpepiece in accordance with the present invention, adjustment of the timekeeping gain/loss can easily be performed to a very high degree of precision, without the necessity for providing a variable capacitor in the standard frequency oscillator circuit. Such adjustment can be performed by switching over the connections of a set of external terminals, each of which functions as a three-position switch.

An electronic timepiece in accordance with the present invention is also suitable for use with a standard frequency oscillator circuit of high frequency, such as of the order of 4 megahertz. Means can be provided for interrupting the operation of parts of the circuit which operate at high frequency, in order to conserve battery power when the timepiece is not actually being used.

It is therefore an object of the present invention to provide an improved electronic timepiece having means for voltage regulation and temperature detection incorporated upon the same integrated circuit chip as is used for timekeeping functions.

It is a further object of the present invention to provide an improved electronic timepiece having means for voltage regulation and temperature detection, whereby output information provided by said temperature detection means serves to control compensation of the timekeeping gain and loss for temperature variations.

It is a further object of the present invention to provide an improved electronic timepiece having means for voltage regulation and temperature detection, whereby output information provided by said temperature detection means serves to control drive voltages applied to a liquid crystal display cell matrix so as to compensate for variations in contrast of said liquid crystal display matrix due to temperature variations.

It is a further object of the present invention to provide an improved electronic timepiece having means for voltage regulation and temperature detection whereby a voltage which is lower than the timepiece battery voltage can be supplied to particular portions of the timepiece circuit.

It is yet a further object of the present invention to provide an improved electronic timepiece having external control terminals provided whereby the timekeeping gain or loss of the timepiece can be precisely adjusted by switching of external connections to said external control terminals.

Further objects, features and advantages of the present invention may be clearly understood from the following description, when taken in conjunction with the attached drawings. The scope claimed for the present invention is given by the appended claims.

In the drawings:

FIGS. 8A–8F are waveform diagrams for various signals produced by the circuits of FIGS. 7A–7D;

Figure 1:
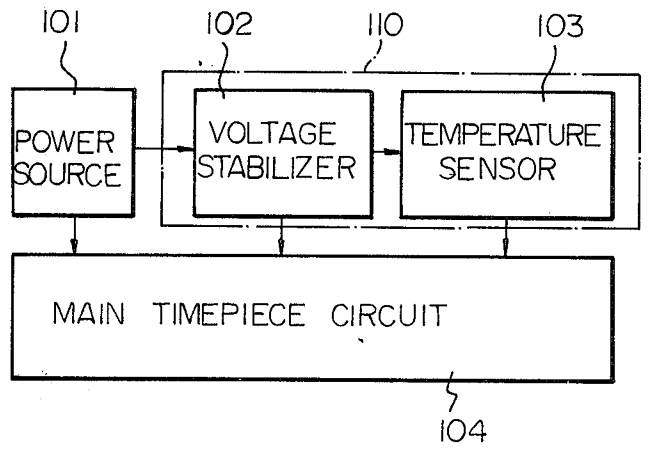
FIG. 1 is a basic block diagram of an electronic timepiece in accordance with the present invention.

Referring now to the drawings, FIG. 1 shows a basic block diagram of an electronic timepiece in accordance with the present invention. Numeral 101 indicates a power source, which would be a battery in the case of an electronic wristwatch. Power source 101 supplies power to a voltage stabilizer circuit 102, which provides an output voltage which is stabilized against changes in the power source voltage due to load variations, or the effects of temperature variations or aging upon the internal resistance of power source 101.

Numeral 103 indicates a temperature-sensitive circuit, such as a ring oscillator. A ring oscillator is very suitable for use as a temperature detection means in an electronic timepiece, due to the fact that signals of precisely known frequency are available, and can be used for comparison with the frequency of the ring oscillator to detect changes in the latter frequency due to temperature variations. Since the frequency of the ring oscillator is also affected by variations in the supply voltage applied to it, it will usually be also necessary to provide some means for stabilizing the supply voltage. In the circuit of FIG. 1, this stabilizing function is provided by voltage stabilizer circuit 102. For this reason, the combination of voltage stabilizer 102 and ring oscillator 103 can be considered as a temperature measuring circuit. A ring oscillator used for temperature measurement in accordance with the present invention is formed of elements such as field effect transistors which are formed directly upon an integrated circuit chip which also accomodates other timekeeping circuitry, and due to the use of such elements has the dependance of frequency upon supply voltage which is described above. A ring oscillator can also be constructed in which an external element such as a thyristor is used to provide temperature sensitivity, and such an oscillator has an output frequency which is almost constant with respect to changes in supply voltage. Thus, such an oscillator does not normally require a stabilized power supply. However, use of such an oscillator does not permit the integration of the temperature sensing components with the remainder of the timepiece circuitry, upon a semiconductor substrate. There is therefore a significant difference between a circuit of conventional type which utilizes a temperature sensing device such as a thermistor or temperature-sensitive resistor and the use of a ring oscillator as a temperature sensing device in accordance with the present invention.

With a ring oscillator used as a temperature sensing device in accordance with the present invention, the oscillation frequency changes abruptly in response to changes in the supply voltage, but only slightly with changes in temperature. This is exemplified by the case of an oscillator which has a frequency of 330 Hz at a supply voltage of 1.5 V, which changes to 400 Hz at a voltage of 1.65 V, and to 700 Hz at a supply voltage of 2 V. However, the frequency will only change by an amount within the range ±30 Hz for a change in ambient temperature of ±20° C. from a reference temperature of 20° C. It is possible to reduce the dependance of oscillation frequency upon supply voltage for a ring oscillator using field effect transistors, by selection of a particular operating voltage, however an improvement of only several tens of a percent can be obtained.

It is known that at one particular value of drain current, the temperature coefficient of the threshold voltage value of a field effect transistor and the temperature coefficient of the transconductance will cancel each other. This current we shall designate as Ido. When the drain current is higher than Ido with the gate voltage relatively high, the temperature dependance of the transconductance will predominate. In this case, the frequency of a ring oscillator using such field effect transistors will decrease with an increase of temperature. When the drain current is smaller than Ido, with a relatively low gate voltage, the frequency of the ring oscillator will increase with increase of temperature, due to the effect of the temperature coefficient of the threshold value. Thus, when such an oscillator is used for temperature measurement purposes, the degree of stabilization provided by the voltage regulator circuit must reduce the ratio of fluctuations in the stabilized output voltage relative to variations of the battery voltage to the order of 1/5 to 1/100,000. It is also necessary for the operating point of the transistors used in such an oscillator to be set at a current value considerably different from Ido.

It should be noted here that it is not necessary for the temperature coefficient of the voltage stabilizer circuit to be very low. A combination of a voltage stabilizer having a large temperature coefficient and a ring oscillator having a very low temperature coefficient will also serve as a temperature measurement circuit. It is for this reason that block 110 in FIG. 1 should be regarded as a temperature measurement circuit portion.

Numeral 104 in FIG. 1 indicates the main body of the timepiece, which receives power from power source 101 and receives temperature information from temperature sensor portion 110. As shown by the broken line, it is also possible to supply power from the voltage stabilizer circuit 102 to parts of the timepiece. For example, in the case of a large electronic timepiece powered by a dry battery, the variation of the battery voltage with time is considerable. It is therefore desirable to supply the quartz crystal standard frequency oscillator circuit of the timepiece with a stabilized voltage. In such a case, it is necessary to select the drain current of the transistors used in the voltage stabilizer circuit 102 such that the temperature coefficient of the circuit is minimized, as described above. This can be done at the stage of integrated circuit pattern design, by suitably arranging the channel length and width of the transistor patterns.

Figure 2:
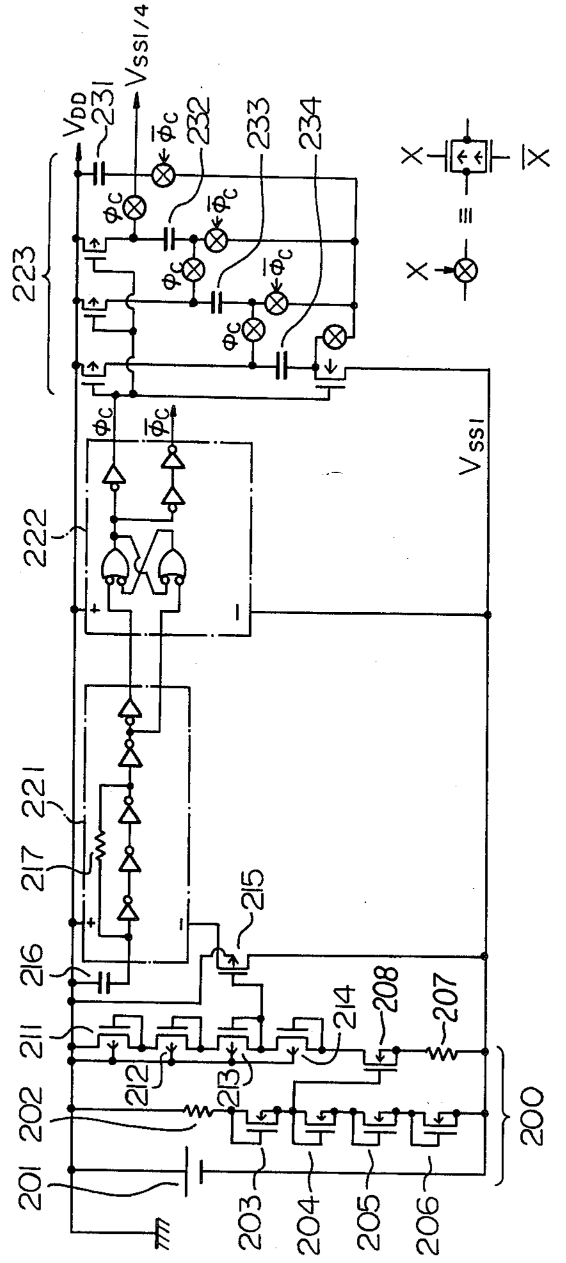
FIG. 2 is a circuit diagram of a voltage stabilizer, temperature detection, and voltage conversion circuit for an electronic timepiece in accordance with the present invention.

Referring now to FIG. 2, a first embodiment of a voltage stabilizer and temperature sensor circuit in accordance with the present invention is shown. Numeral 201 indicates a timepiece battery, and 202 is a resistor which is connected to a chain of N-channel field effect transistors 203, 204, 205 and 206. The drain and gate terminals of each of transistors 203 to 206 are connected together, causing the voltage-current characteristics of each transistor to resemble that of a zener diode. In other words, almost no current can flow between the source and drain terminals of each transistor while the voltage between them is less than the threshold voltage, while current immediately begins to flow when the voltage between source and drain exceeds the threshold voltage. We shall designate this threshold voltage as $V_{TN}$. If the voltage of battery 201 is equal to or less than the threshold voltage of series-connected transistors 203 to 206, then the voltage across these transistors will be identical to the battery voltage. If the battery voltage is higher than the total of the threshold voltages of transistors 203 to 206, i.e. is greater than $4.V_{TN}$, than the difference in voltage will appear across resistor 202, while a voltage slightly higher than $3.V_{TN}$ will appear across transistors 204 to 206. The drain of transistor 203 is connected to the gate of an N-channel transistor 208, which has a resistor 207 connected in its drain lead. Resistor 207 and transistor 208 constitute a current source. A voltage $V_{TN}$ appears between the gate and source of transistor 208, while a voltage $2.V_{TN}$ appears across resistor 207. As a result, the drain current transistor 208 is approximately equal to the value obtained by dividing the voltage $3.V_{TN}$ by the resistance of resistor 207. However, any considerable change in the battery voltage, resulting in a change in the gate voltage of transistor 203, will cause a slight variation in the drain current of transistor 208. Thus, resistor 202 and transistors 203 to 206 constitute a constant voltage circuit, while resistor 207 and transistor 208 constitute a constant current circuit, operated by the voltage $3.V_{TN}$ appearing across transistors 204 to 206. It is possible to cascade such circuits, by applying the voltage across resistor 207 to a succeeding voltage regulator circuit.

P-channel transistors 211, 212, 213 and 214 are connected in series, with the gate and drain terminals of each transistor being connected together, to provide a constant-voltage type of voltage-current characteristic, as explained above for the case of transistors 203 to 206. The drain current of transistor 208 passes through transistors 211 to 214. Since this drain current is fairly constant, a voltage appears between the source of transistor 211 and the drain of transistor 214 which is highly constant with respect to variations in the voltage of battery 201.

It is possible to cascade a number of voltage stabilizer circuits such as that shown in FIG. 2, in order to provide as high a degree of voltage stabilization as is desired. Such cascading is facilitated by the use of alternate P-channel and N-channel transistors for successive voltage stabilization stages, alternately connected to the positive side and the negative side of the power source. The current consumed by a voltage stabilization circuit such as that of FIG. 2 can be as low as a few nanoamperes, due to the use of field effect transistors. The output from the voltage stabilizer circuit of FIG. 2 is applied to the gate of a P-channel field effect transistor 215, which is connected in source follower configuration. The source of transistor 215 is connected to the low potential voltage supply lead of a ring oscillator circuit 221, shown in a broken line rectangle. A resistor 217 and capacitor 216 are incorporated to ensure sufficient phase shift around the oscillator feedback loop, however it may be possible to omit either or both of these, depending upon the particular integrated circuit design involved. As stated previously, temperature information can be obtained from ring oscillator 221, by comparing the oscillation frequency with the frequency of some standard signal. A signal can thus be obtained which can be used to apply compensation for variations in the frequency of the quartz crystal standard frequency oscillator of the timepiece caused by temperature variations. In the case of the circuit shown in FIG. 2, the output of ring oscillator 221 is also utilized to drive a voltage converter circuit 223, after conversion of the level of the output signal from oscillator 221 up to the level of the power supply. This conversion is performed by level shifter circuit 222, which produces output signals $\phi_c$ and $\phi_c$, which are applied to voltage converter circuit 223. Four capacitors, 231, 232, 233 and 234 in voltage converter circuit 223 are alternately switched between connection in series, between $V_{dd}$ and $V_{ssl}$ of the battery 201, and connection in parallel with each other. The series connection is established when signal $\phi_c$ is at the high potential level $V_{dd}$ (referred to hereinafter as the H level) and the parallel connection is established when signal $\phi_c$ is at the low potential level $V_{ssl}$ (referred to hereinafter as the L level). This switching is performed by field effect transistors and voltage controlled switches connected to capacitors 231 to 234. Within a short period of time after power is applied to the circuit, the voltage across each capacitor 231 to 234 becomes equal to $\frac{1}{4}$ of the battery voltage, and an output voltage designated as $Vss_{\frac{1}{4}}$ is obtained. This output voltage can be utilized to supply power to portions of the timepiece circuit which operates at a high frequency, such as the quartz crystal standard frequency oscillator circuit, the initial stages of frequency division after the standard oscillator circuit, etc. Low voltage operation of such circuits enables the power consumption of the timepiece to be substantially reduced. This is particularly important for timepieces using quartz crystal oscillators of very high frequency, of the order of 4 MHz, for example, since the current drawn by the integrated circuit portions which deal with such a high frequency is considerably larger than in the case of low frequencies, such as in the case of a timepiece having a standard frequency oscillator of 50 kHz. Use of such a capacitor switching type of voltage converter as has been described above is more economical from the viewpoint of power consumption than using a combination of resistive elements and semiconductor elements for voltage reduction, since power is necessarily dissipated in the resistive elements in the latter case. Since a ring oscillator is already available, for temperature sensing purposes, in an electronic timepiece according to the present invention, it is not necessary to provide an additional oscillator to drive voltage converter 223.

Figure 3:
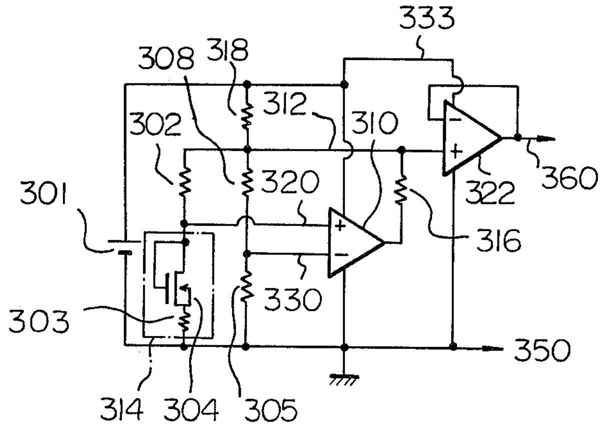
FIG. 3 is a circuit diagram of another embodiment of a temperature detection circuit.

Referring now to FIG. 3, a second embodiment of a voltage stabilizer circuit is shown. The circuit of FIG. 3 utilizes a voltage sensing element 314 having a non-linear voltage/current characteristic. Such an element is typified by a zener diode, however various other types of element are applicable to the circuit of FIG. 3. In this embodiment, a resistor 303 is connected in the drain lead of a N-channel field effect transistor 304 having its source and gate terminals connected, to constitute non-linear sensing element 314. Element 314 is connected in a bridge circuit with resistors 302, 308 and 306. Output leads 320 and 330 of this bridge circuit are connected to the input terminals of a differential amplifier 310, the output of which is fed back to the junction of resistors 302 and 308 of the bridge circuit, which is also connected to the positive side of battery 301 through resistor 318. This circuit acts to maintain a constant voltage at the junction of resistors 302 and 308, in spite of variations in the voltage of battery 301. A stabilized voltage supply at a low impedance level is thereby provided from the output of a buffer amplifier 322, having an input terminal connected to the junction of resistors 302 and 308.

The circuit of FIG. 3 functions basically by detecting changes in the difference between the voltages developed across non-linear sensor element 314 and resistor 306. Due to the high amplification of differential amplifier 310, even a non-linear sensor element such as a rectifier diode having a relatively smoothly varying characteristic can provide a high degree of stabilization. In the case of the voltage stabilizer circuit shown in FIG. 2, effective stabilization using such elements which have a smoothly varying voltage/current characteristic, is obtained by cascading groups of such elements. Use of either a voltage stabilizer circuit such as that of FIG. 2 or that of FIG. 3 enables highly effective voltage stabilization to be achieved without the necessity for using special elements having a sharply non-linear voltage/current characteristic, such as a zener diode, and enables of such elements as field effect transistors, which are readily available on the integrated circuit chip of a timepiece, to be used as non-linear voltage sensing elements.

Referring again now to the voltage stabilizer circuit of FIG. 2., it should be noted that the connection of a constant-voltage stage (comprising resistor 202 and transistors 203 to 206), to a constant current stage (consisting of resistor 207 and transistors 211 to 214) is inherently capable of providing a very high degree of voltage stabilization. This is due to the fact that, for example, if the voltage of battery 201 should drop, then the voltage across transistors 204 to 206 will also drop, although by a smaller degree. However, as a result of the latter voltage drop, the current through resistor 207 and transistors 201 to 214 will decrease, thereby causing a decrease in the voltage drop across transistors 201 to 214. The output voltage of the circuit (in this case taken from the drain terminal of transistor 213) will thereby be compensated for the fall in battery voltage.

The output of the voltage stabilizer circuit of FIG. 2 is supplied through a transistor 215 which is connected as a source follower. A drop in voltage occurs between the gate and source of transistor 215, corresponding to the threshold voltage of this transistor. This disadvantage of a source follower type of output can be eliminated by using a negative feedback amplifier instead of transistor 215. However a source follower output stage has the advantage of providing a large phase margin, ensuring a good response to any abrupt changes in the voltage which is input to it, without the danger of spurious oscillation or hunting which can occur with other types of negative feedback amplifier having a higher value of feedback loop gain.

In order to reduce the voltage drop across a source follower transistor used as an output of a voltage stabilizer circuit such as that of FIG. 2, it is possible to lower the threshold voltage of the source follower transistor to close to zero, by the use of an ion implatation technique, which is already known in the art. Recent developments in semiconductor technology have enabled the threshold voltages of transistors in particular localized areas of an integrated circuit chip to be lowered with respect to the threshold voltage of transistors in other areas of the chip. Ion implantation to reduce threshold voltages can also be applied to enable transistors in certain portions of a timepiece circuit which must be operated at a low supply voltage in order to reduce power consumption, to be effectively operated at such low voltages. Such portions of the circuit include the standard frequency quartz crystal oscillator section, and the initial stages of frequency division after the output from the standard frequency oscillator.

In the circuit of FIG. 2, the output from the voltage stabilizer circuit is applied through transistor 215 from the source of transistor 213 rather than the source of transistor 214. This is in order to lower the voltage applied to ring oscillator circuit 221, so as to reduce the power consumed therein. It should be noted here that, since the sensitivity of ring oscillator 221 to changes in supply voltage is much higher than its sensitivity to changes in operating temperture, ring oscillator 221 could be equally well employed as a voltage sensor circuit, simply by supplying power to it directly from battery 201, rather than from the output of voltage stabilizer output transistor 215. This will be exemplified in a further embodiment of the present invention shown in FIGS. 7A to 7B, and described hereinafter, in which a ring oscillator is alternately switched between a temperature sensing and a voltage sensing condition.

With regard to the power consumption of a ring oscillator such as that of FIG. 2, supplying a low voltage to the oscillator circuit as described above enables a power consumption as low as 5 nanowatts to be achieved. The power consumption of the level shifter connected to receive the output of the ring oscillator 221 can be reduced by performing level shifting in a plurality of stages, rather than in a single stage as shown in FIG. 2. In this case, the output signal from the ring oscillator is increased gradually throughout the level shifting stages. For example, an additional lever shifter circuit, receiving a negative supply voltage equal to the source voltage of transistor 208, could be inserted between ring oscillator circuit 221 and level shifter circuit 223. Level shifting would thus be performed in two stages rather than in one.

As stated previously, the output voltage $Vss_{\frac{1}{4}}$ of voltage converter circuit 223 can be used to supply portions of the electronic timepiece circuitry which operate at a high frequency. In this case, a voltage stabilizer stage can be added at the output of voltage converter 223. Such a stabilizer can consist of, for example, a source follower circuit having the output voltage of voltage converter 223 connected to the drain of the source follower transistor and stabilized output voltage of voltage stabilizer circuit 200 connected to the gate terminal as a reference voltage.

Instead of driving a temperature sensing oscillator such as 221 in FIG. 2 from a constant voltage source, it is possible to drive it from a constant current source. For example, ring oscillator 221 in FIG. 2 could be supplied from the source of transistor 208, rather than from the source of transistor 215. If this is done, it may be necessary to provide a decoupling capacitor across the power supply terminals of oscillator 221, to ensure that sufficient loop gain is provided for oscillation to occur.

Although oscillator 221 has been referred to as a temperature sensing oscillator, while circuit 200 has been designated as a voltage stabilizer circuit, voltage stabilizer circuit 200 will also have a temperature coefficient, i.e. its output voltage will vary with changes in operating temperature. Thus, strictly speaking, the combination of voltage stabilizer circuit 200 and ring oscillator circuit 221 should be regarded as a temperature sensing circuit. The transistor elements of voltage stabilizer circuit 200 are operated at a very low value of drain current, so that the temperature coefficient of the threshold voltage of the transistors will predominate. The output voltage of the voltage stabilizer will therefore tend to rise as the operating temperature falls. The voltage coefficient of the combination of voltage stabilizer and ring oscillator will have a combined value which depends on the temperature coefficients of the voltage stabilizer circuit and ring oscillator circuit individually. Since the output voltage of the voltage stabilizer circuit rises with a fall in operating temperature, this voltage rise may cancel the effect of the fall in temperature upon the frequency of the ring oscillator circuit. Thus, in some cases, the use of a voltage stabilizer circuit to supply the ring oscillator may result in a reduction in capability for sensing changes in temperature. This occurs if the field effect transistors which are used in the voltage stabilizer circuit and in the ring oscillator circuit have the same electrical characteristics. This problem can be overcome by operating the transistors of the voltage stabilizer circuit and the ring oscillator circuit at different levels of current. Alternatively, transistors which are physically different, such as having different channel widths, may be used in the voltage stabilizer circuit and ring oscillator circuit respectively. Another solution to this problem is to utilize ion implantation to provide different electrical characteristics for the transistors of the voltage stabilizer circuit and the ring oscillator circuit. A further method of solving this problem is described in relation to another embodiment of the present invention, shown in FIG. 5 and described hereinafter.

Figure 4A:
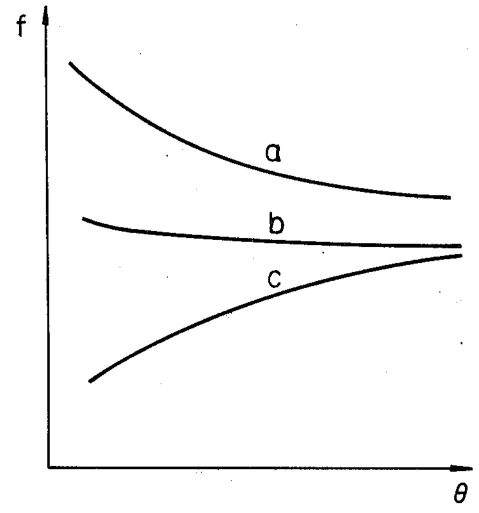
FIG. 4A and FIG. 4B are graphs illustrating the characteristics of a temperature detection circuit such as that shown in FIG. 2, and regulation characteristics of a voltage stabilizer circuit such as that shown in FIG. 2, respectively.

Referring now to FIG. 4A, a graph is given therein showing the temperature/frequency characteristics of a ring oscillator formed of field effect transistors on an integrated circuit chip. The ordinate axis corresponds to frequency f and the abscissa corresponds to temperature $\theta$. Curves a, b and c show the characteristics which are obtained by driving the oscillator transistors with a high, intermediate and low level of source voltage respectively. The characteristic a results from the dependancy of carrier lifetime upon temperature. Characteristic c results from the dependency of the threshold voltage of the transistors upon temperature, due to a low level of drain current being passed through the transistors.

Figure 4B:
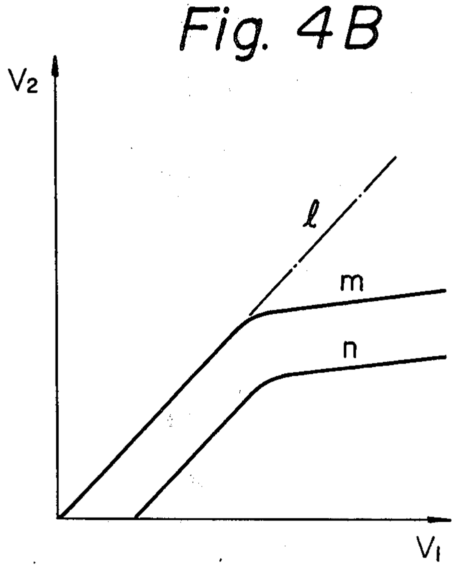

Referring to FIG. 4B, the regulation characteristics of a voltage stabilizer circuit such as that of FIG. 2 are shown. The ordinate axis corresponds to the output voltage V2 of the circuit, while the abscissa corresponds to the battery voltage V1. Line 1 in FIG. 4B indicates the voltage characteristic without stabilization, as would result if transistors 203 to 206 and 211 to 214 in the circuit of FIG. 2 were replaced by resistors. Line m shows the relationship between the voltage appearing at the gate of transistor 215 and the voltage of battery 201. Line n indicates the relationship between the voltage appearing at the source of transistor 215 (i.e. the voltage between that point and Vdd) and the battery voltage.

Figure 5:
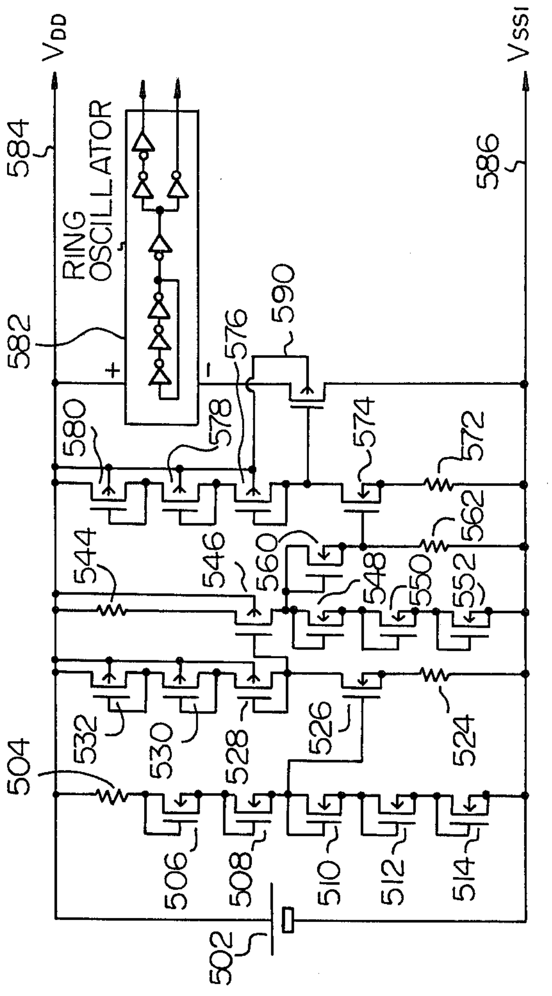
FIG. 5 is a circuit diagram of another embodiment of the voltage stabilizer and temperature detection portions of the circuit shown in FIG. 2.

Referring now to FIG. 5, a second embodiment of a combination of a voltage stabilizer circuit and a temperature sensing ring oscillator circuit is shown. Numeral 584 and 586 indicate the positive and negative supply leads of a battery 502, respectively. Resistor 504, which is a diffusion resistor having a high value, is connected in series with N-channel enhancement type field effect transistors 506, 508, 510, 512 and 514 each of which has its gate and grain terminals connected together to form a constant-voltage diode, as described previously with respect to FIG. 2. The voltage at the drain of transistor 510 is connected to the gate of transistor 526, which has a resistor 524 connected in its drain lead to form a constant current source. The drain current of transistor 526 passes through a set of series-connected P-channel transistors 528, 530 and 532, which also have gate and drain terminals connected. A stabilized voltage can therefore be obtained at the drain terminal of transistor 528, which is applied to the gate of a P-channel transistor 546. Another set of N-channel transistors 548, 550 and 552 connected as constant voltage diodes is connected in series with transistor 546. The voltage at the drain of transistor 548 is applied to an N-channel transistor 560, having its gate and drain terminals connected together and is connected in series with a resistor 562 to the battery lead 586. Transistor 560 and resistor 562 therefore serve as a voltage divider, and the voltage appearing across resistor 562 is applied to the gate of another N-channel transistor 574 which has a resistor 572 connected in its drain lead to form a constant current source. The drain current of transistor 574 is passed through series-connected P-type field effect transistors 580, 578 and 576, each of which has its drain and gate terminals connected to form a constant voltage diode. The voltage appearing at the junction between transistors 574 and 576 is applied to the gate of a P-channel transistor 590, which is connected in source follower configuration to the negative power supply lead of a temperature sensing ring oscillator circuit 582.

It will be apparent that the components of the circuit of FIG. 5, other than ring oscillator 582, basically constitute a pair of voltage stabilizer circuits connected in cascade, with each of the latter stabilizer circuits being similar to that shown in FIG. 2 and described previously. This cascade arrangement ensures an extremely high degree of voltage stabilization at the source of transistor 590. In addition, the voltage drop across transistor 560 will increase as the operating temperature of the circuit decreases. This serves to prevent the voltage coefficient of the temperature sensing oscillator 582 being cancelled by the tendancy for the output voltage of the voltage stabilize circuit to increase as the temperature decreases. If necessary, several of such temperature compensating transistors as transistor 560 can be utilized, to increase the effect described above.

The use of temperature compensating transistors in a voltage divider arrangement, as exemplified by transistor 560 in FIG. 5, enables a combination of a voltage stabilizer and a temperature sensing oscillator to be utilized on a single integrated circuit chip, with both the voltage stabilizer and oscillator circuits incorporating transistor elements having the same geometry, electrical characteristics, and operating current.

Figure 6A:
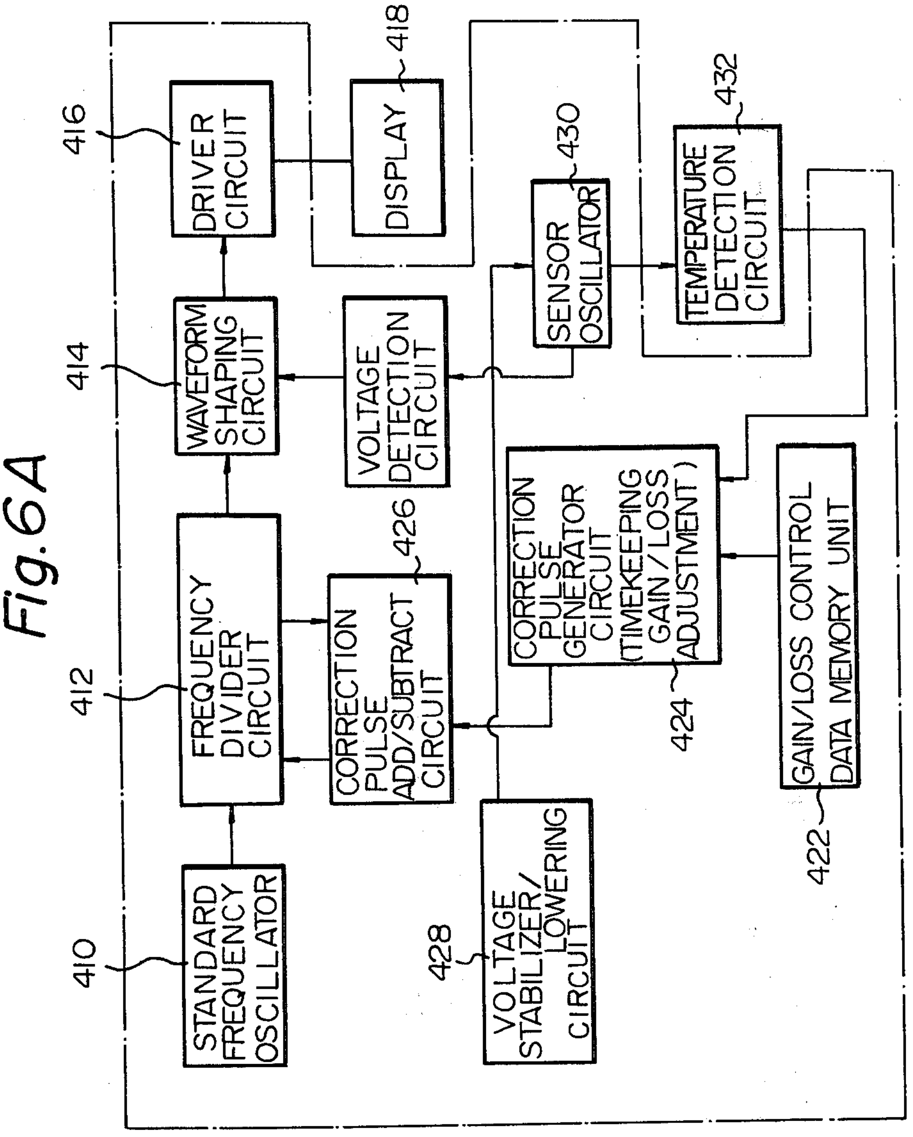
FIGS. 6A and 6B are general block diagrams of embodiments of an electronic timepiece in accordance with the present invention.

FIG. 6A is a block diagram of an electronic timepiece in accordance with the present invention. Parts shown within the broken line are contained upon the main integrated circuit chip of the timepiece. A standard frequency oscillator circuit 410 provides a standard frequency signal to a frequency divider 412. A low frequency standard time signal is output from frequency divider 412 and applied to a driver circuit 416, which produces drive pulses to drive an analog type of time display having a stepping motor and time indicating hands. Adjustment of the timekeeping gain or loss can be performed by changing connections within a data memory unit 422, which controls the generation of correction pulses by a correction pulse generator circuit 424. These correction pulses are applied to an add/subtract circuit 426, in which they are either added to or subtracted from a train of timekeeping pulses from frequency divider 412. Correction pulses are either added or subtracted in accordance with whether terminals in data memory unit 422 are connecccted to a high or to a low potential.

A voltage stabilizer circuit 428 supplies a stabilized voltage to a sensor oscillator 430, to enable temperature sensing to be performed by detecting variations in the output frequency of oscillator 430 by temperature detection circuit 432. Control of timekeeping gain/loss to compensate for temperature variations is performed by an output from 432 applied to the correction pulse generation circuit 424.

Referring now to FIG. 6E, a block diagram is shown therein of an embodiment of an electronic timepiece in accordance with the present invention. The integrated circuit chip is designated by the numeral 600. Numeral 601 indicates a data memory unit, provided externally to integrated circuit chip 600, which is used to correct the running rate of the timepiece, i.e. the timekeeping gain or loss, by setting one or more of two sets of three-position switches to appropriate positions. Although the term "switch" is used here for this merely implies that, for example, terminal 602A can be either linked to terminal 602B, linked to terminal 602C, or can be left unconnected with either 602B or 602C. Input terminal of each switch includes a flip-flop arranged to reduce power consumption caused when the input terminal is connected to the H or L potential level. Power is supplied from a battery 606. A standard frequency oscillator circuit 612 produces a standard frequency signal of $2^{22}$ Hz, determined by an AT-cut quartz crystal vibrator 610. This signal is applied to a variable division ratio frequency divider 614, and through a control circuit 616 which controls various functions within the circuit of chip 600, to a pulse generator circuit 620. In pulse generator 620, further frequency division is performed, to provide various signals such as A, B and C which are used in conjunction with data memory unit 601 to control the running rate of the timepiece to a desired value. Pulse generator 620 also produces signals of low duty cycle, having a period of two seconds, and differing in phase from each other by 180°, designated as $P_A$ and $P_B$. These signals are applied to a display driver circuit 628 to produce drive signals $Q_A$ and $Q_B$ to drive the stepping motor of an analog type time display 608.

Numeral 622 indicates a running rate control signal generator, which functions in conjunction with data memory unit 601 and with signals produced by pulse generator circuit 620 to produce a correction signal Pfc. Correction signal $P_{fc}$ is applied to control the division vatio of frequency divider 614. Depending upon the positions of the switches 601 and 603 of data memory circuit 601, correction pulses are, in effect, either added or subtracted to the output signal of standard frequency oscillator circuit 612. The rate at which correction pulses Pfc are added or subtracted is determined by which of switches 601 or 602 have been set to either the high potential side of battery 606 (i.e. to the circuit ground potential) or to the low potential side of battery 606 (i.e. to voltage |Vss1|).

Numeral 601 designates a set of coarse adjustment frequency control switches, which are connected to a set of coarse frequency control input terminals Jc27, Jc9, Jc3 and Jc1. Numeral 603 indicates a set of fine adjustment frequency control switches, which are connected to a set of fine frequency control input terminals Jf27, Jf9, Jf3 and Jf1 on integrated circuit chip 600. When each of the input terminals Jc27, Jc9, Jc3, Jc1, Jf27, Jf9, Jf3 and Jf1 is in an open or floating state, that input terminal has a voltage waveform of 1 Hz. Each of the coarse and fine frequency control input terminals is weighted. Thus, for example, if terminal Jf1 is set to the Vss1 potential by the setting of data memory unit 601, then the timekeeping rate of the timepiece will be lowered by a factor of 4 in $10^{-8}$. If terminal Jf1 is set to the circuit ground potential, i.e. to the high potential level, then the timekeeping rate will be increased by a factor of 4 in $10^{-8}$. Thus, very fine control of timekeeping gain/loss is possible. If terminal Jf27 is set to the low potential of the circuit, then the timekeeping rate will be decreased by a factor of 108 in $10^{-8}$, and if this terminal is set to the high potential then the timekeeping rate is increased by 108 in $10^{-8}$ (i.e. by 1.08 parts per million). Similarly, when coarser control of the timekeeping rate is required, terminals Jc27 to Jc1 can be selectively set to either the high or low potential of the battery 606. This enables the gain/loss of the timepiece to be adjusted within the range of 1.2 parts in $10^{-6}$ to 32.4 parts in $10^{-6}$. The input terminal Jf1 may be coupled to an IC chip of an option system to control the timekeeping rate in response to a clock signal $\phi_8\uparrow$ to perform temperature compensation. The input terminals Jf3 and Jf9 may also be used for biasing the stepping motor to perform seconds zeroing, clockwise or counter-clockwise rotation of the hand, etc., in a manner as disclosed in a U.S. Pat. No. 3,948,036. In this case, both of the reset terminals $R_1$ and $R_2$ are set to the "H" potential level.

Numeral 626 indicates a circuit block which contains a ring oscillator circuit which can be used to perform both a temperature sensing function and a battery voltage level sensing function, by being alternately connected to the voltage of battery 606 and to the stabilized voltage output of voltage stabilizer circuit 618. Circuit block 626 also includes a variable division ration frequency divider whose division ration can be adjusted by altering the connections of control switches 604 in data memory unit 601, which are connected to control input terminals Vr1 and Vr3 of integrated circuit chip 600. An output signal $V_{BL}$ from this circuit block serves to cause the seconds hand of time display 608 to be advanced at a rate of twice in every two seconds, instead of the normal rate of once per second, when the oscillator frequency of the oscillator in block 626 indicates that the battery voltage has fallen below a predetermined level. This provides a warning indication to the timepiece user that battery replacement is necessary.

External control switches 630 and 632 can be connected to control terminals 629 and 631, to perform various control functions. Numeral 605 indicates a temperature compensation control circuit, which receives the output of frequency divider 614 from terminal 635 and the output of ring oscillator 626, from terminal $V_{RL}$ (during intervals in which ring oscillator 626 is supplied with the stabilized voltage output of stabilizer circuit 618), and produces output signals b which are applied to the fine frequency control input terminals Jf1 to Jf7. Thus, the running rate of the timpiece can be precisely compensated for changes in the frequency of standard frequency oscillator 612 due to the effects of temperature upon quartz crystal vibrator 610.

Figure 6B:
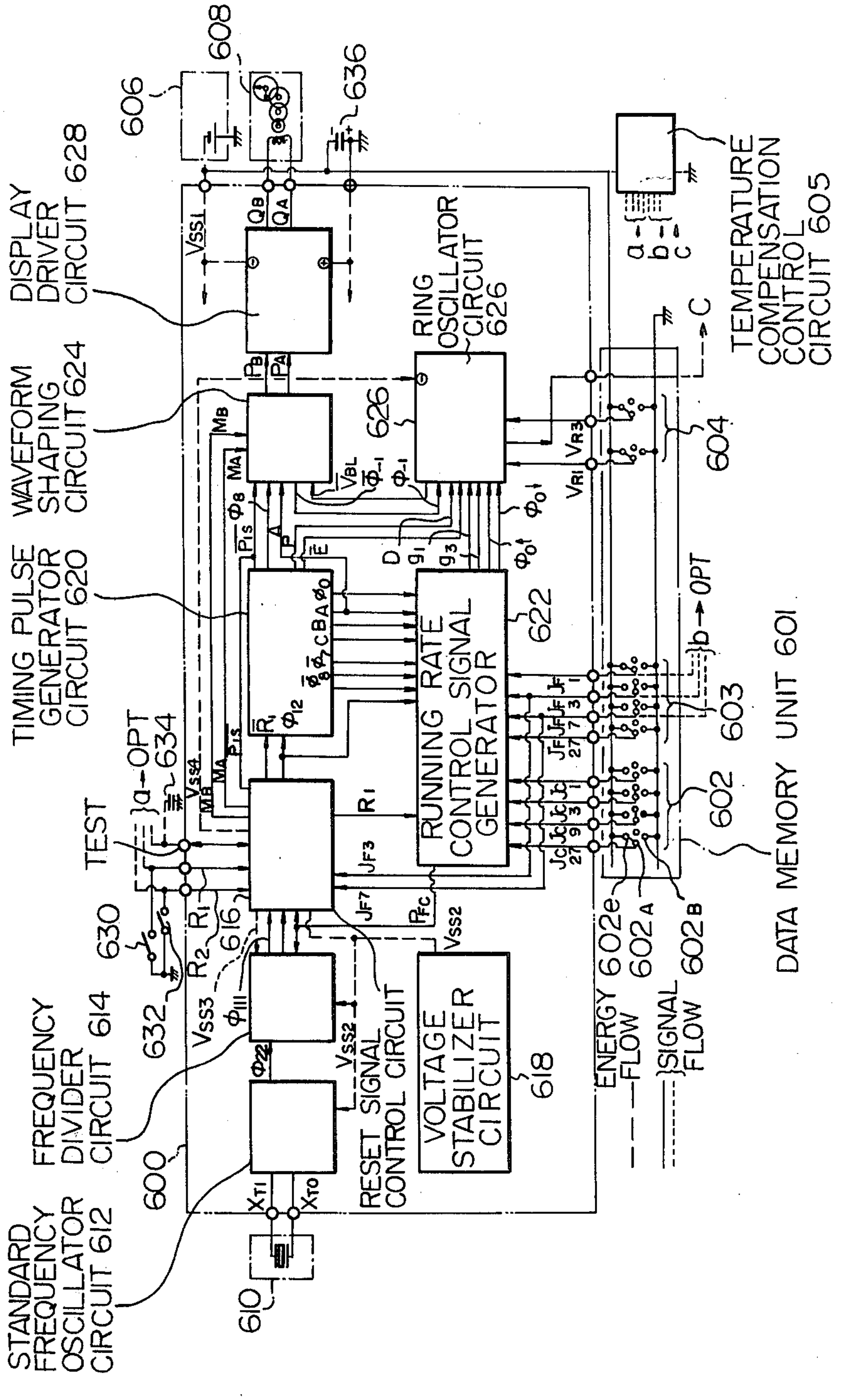
Figure 7A:
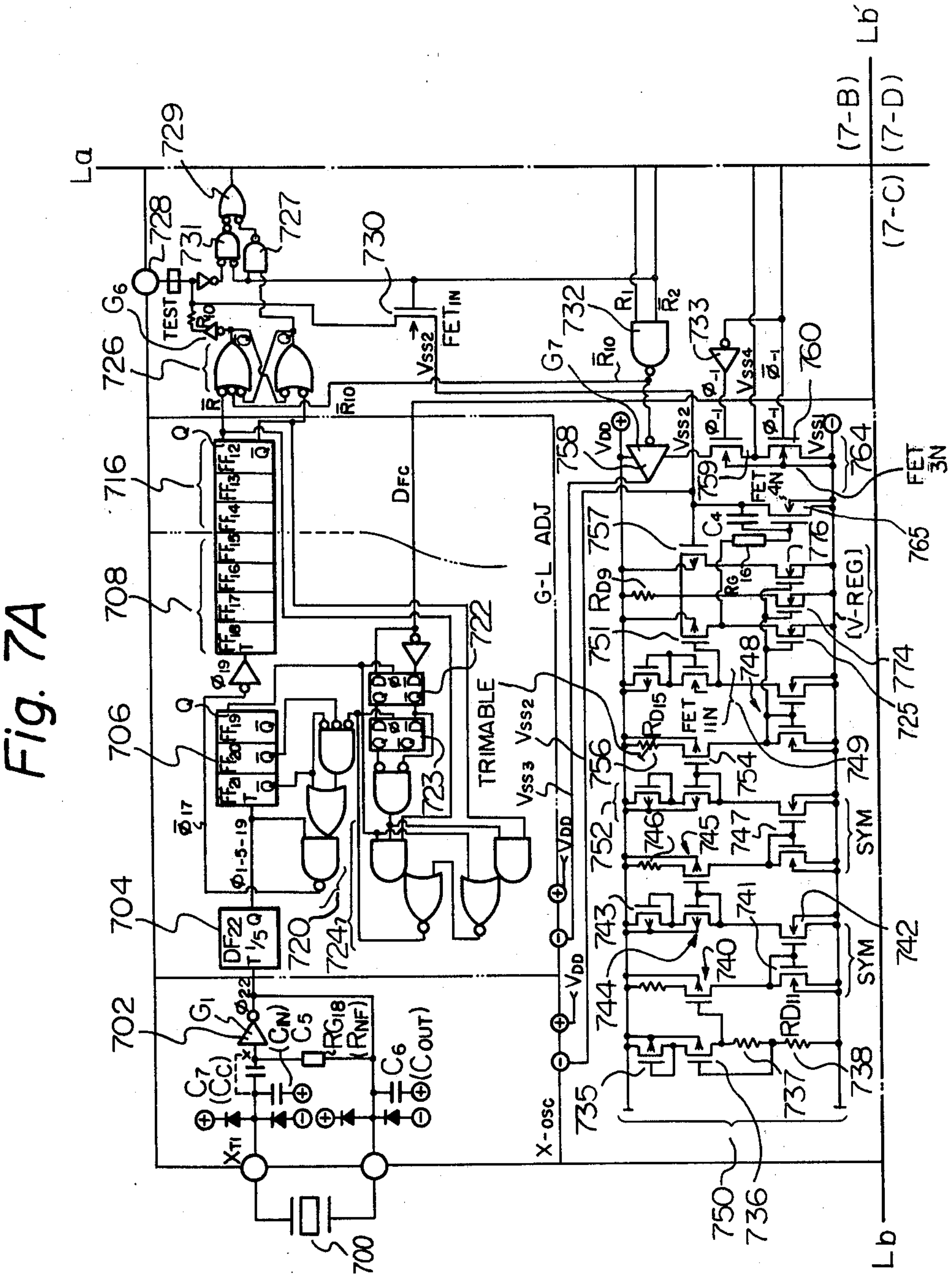
FIG. 7A, FIG. 7B, FIG. 7C and FIG. 7D are sections of a circuit diagram of an embodiment of an integrated circuit for the electronic timepiece shown in FIG. 6.
Figure 7B:
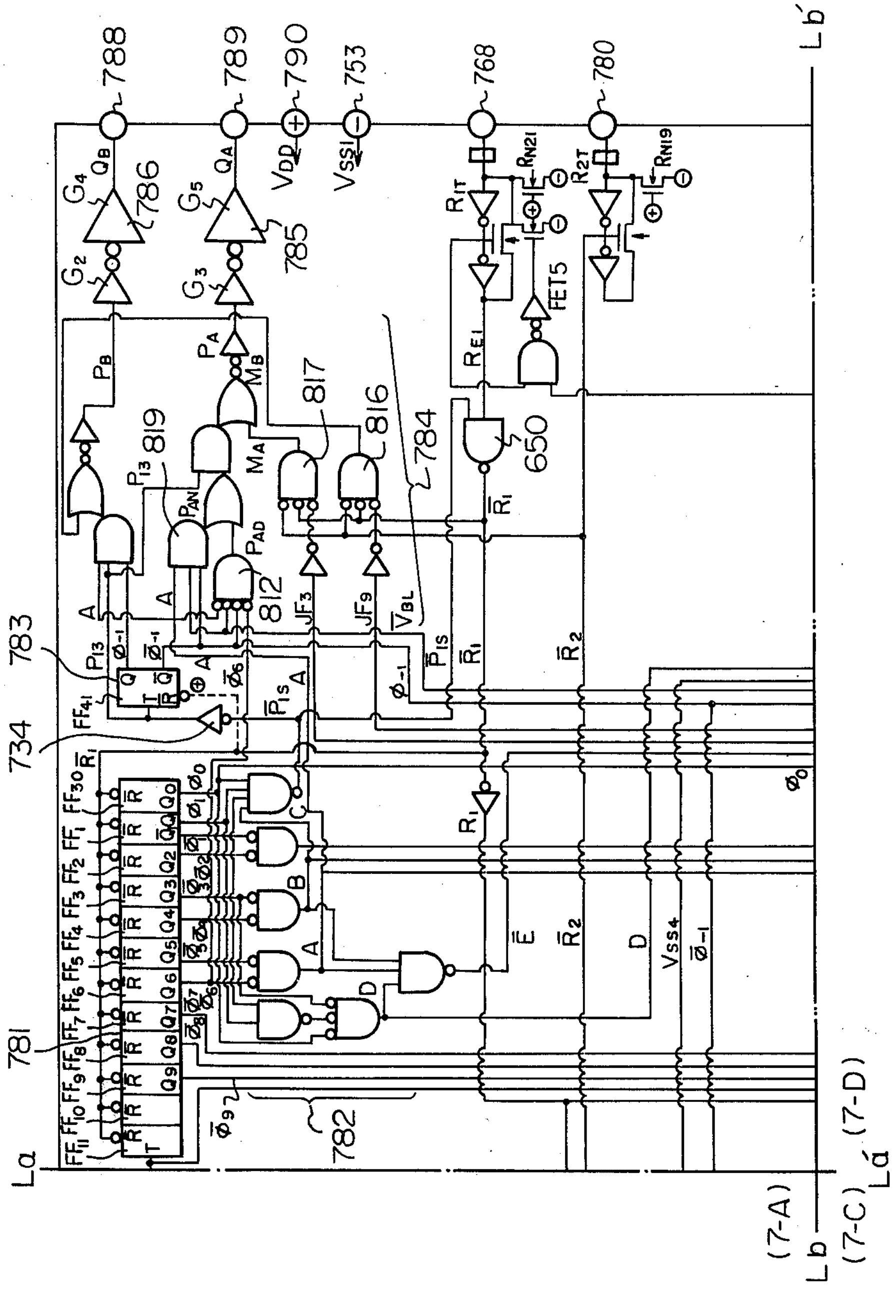
Figure 7C:
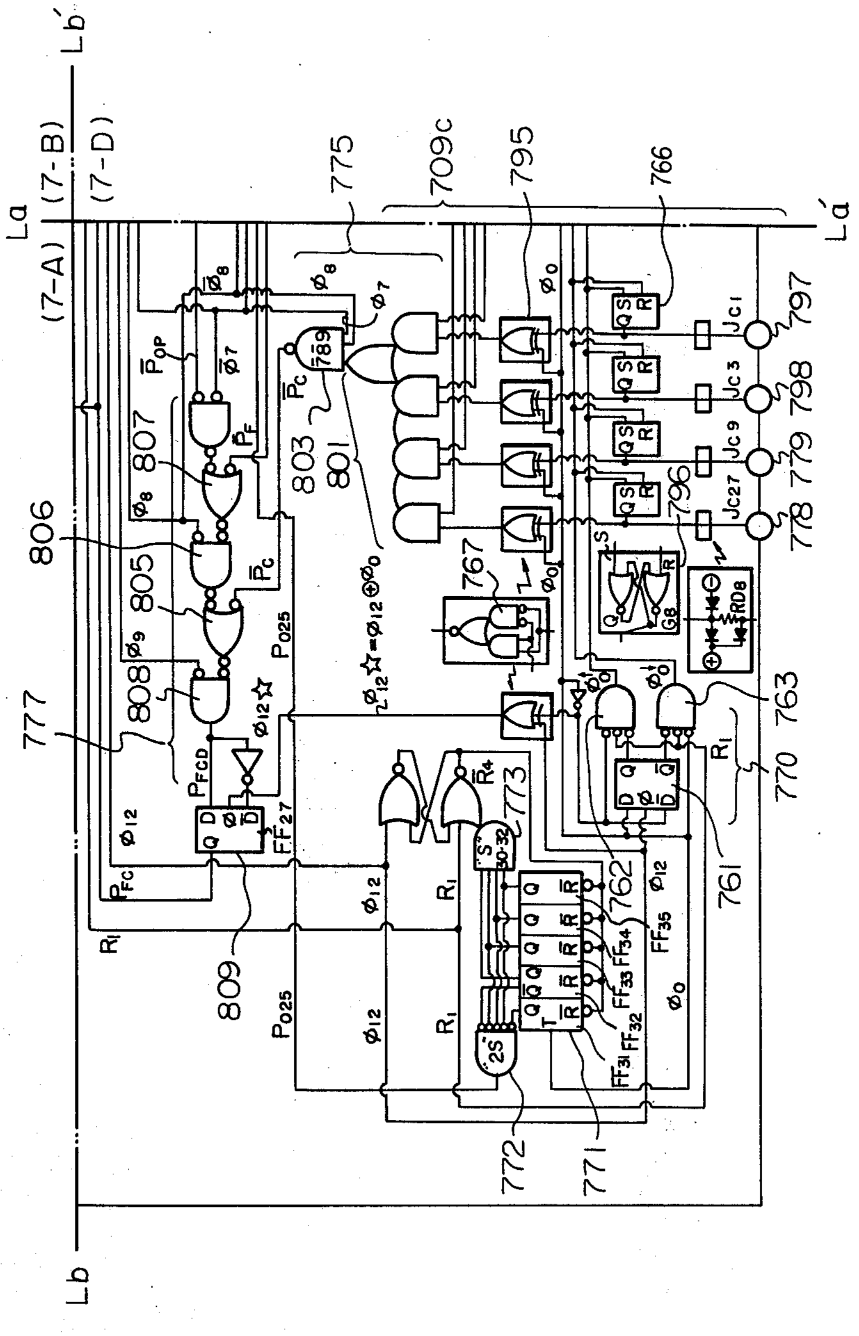

Referring now to FIGS. 7A, 7B, 7C and 7D, sections of a circuit diagram of the integrated circuit chip 600 of FIG. 6 are shown therein. The following description of this circuit may be more easily understood by referring also to the waveform diagrams of FIGS. 8A, 8B, 8C and 8D, which illustrate the waveforms appearing in the circuit of FIGS. 7A to 7D during a period of two seconds. Referring first to FIG. 7A, standard frequency oscillator 702 is connected by terminals Xt1 and Xt0 to an At-cut quartz crystal vibrator 700 oscillating at a relatively high frequency signal of about 4 megahertz and its output signal is applied to a divide-by-five dynamic type frequency divider 704. The oscillator 702 has a capacitor C7 for providing a temperature resistance, an input capacitor C5 and an output capacitor C6. The oscillator 702 thus arranged is supplied with a stabilized voltage as will be described later. The output of frequency divider 704 is applied to static frequency dividers 706, 708 and 710. Output signals from frequency dividers 706 and 710 are applied to a division ratio control circuit composed of data-type flip-flops 722 and 723 and gate circuits 720 and 724. The division ratio between the input and output of frequency divider 706 is thereby controlled in accordance with correction signal Pfc, as will be described later. Namely, when the correction signal is at 1 Hz, the division ratio is finely adjusted in the order of $\pm 1.2$ ppm. In order to reduce the power consumption of the high frequency portions of the timepiece circuit, oscillator circuit 702 and frequency dividers 704 and 710 are supplied with a lower value of voltage than the rest of the circuitry, from a voltage stabilizer circuit 750. Level conversion is therefore necessary at the output of frequency divider 710, and is performed by level converter circuit 726. The level shifted output is applied through gates 727 and 729 to a static frequency divider 781. Frequency divider 781 produces varius square-wave signals $\theta_9$ to $\theta_0$, with the latter signal having a period of one second. These signals are applied to gates 782, to produce timing signals A, B, C, D and E, which are used in generating weighing signals $P_1$, $P_3$, $P_9$ and $P_{27}$ to be used for producing correction signals Pfc, and in alternately applying the battery voltage and a stabilized voltage from voltage stabilizer circuit 70 to a ring oscillator circuit 791.

In order to enable satisfactory operation at a low level of supply voltage, the transistors used in inverter 702, frequency dividers 704, 706 and 703, flip-flops 722 and 723, and gate circuits 720 and 724, have a lower value of threshold voltage than the transistors used in other parts of the integrated circuit chip, namely, a threshold voltage of 0.25 V, as opposed to a threshold value of 0.5 volts in other parts of the integrated circuit. In addition, the gate oxide film thickness used in these transistor which have a low value of threshold voltage is 300 angstroms, as compared with a thickness of 1000 angstroms in the transistors used in other parts of the integrated circuit chip. For this embodiment of the present invention, this lowering of the threshold voltage is achieved by varying the geometry of the transistor patterns. Those transistors which have a low value of threshold voltage have a channel length of about 4 microns, and a channel width of about 4 microns, whereas the transistors in other parts of the circuit have a channel width of 8 microns and a channel length of 8 microns.

Reduction of the channel length and channel width of the transistors on an integrated circuit chip tend to lower the yield of usable chips obtained at the time of manufacture. However, by only reducing the channel width and length of the transistors used in a high operating speed part of the integrated circuit, the reduction in yield can be minimized.

It is also possible to selectively lower the threshold voltage of the transistors in the high operating speed part of the integrated circuit by means of ion implantation.

Selective treatment of only the transistors in the high operating speed part of the circuit is also desirable from the viewpoint of the thickness of the gate oxide film. To enable the signals of low amplitude, it is necessary to reduce the thickness of this gate oxide film as far as practicable. However, this tends to increase the leakage current of the transistors, and so it is desirable to utilize a thin gate oxide film only in the part of the circuit which operates at high frequency, i.e. the part of the circuit closely associated with the standard frequency quartz crystal vibrator.

Gates 782 also produce a signal $P_{1s}$, which is inverted by inverter 734 to produce a signal $P_{1s}$ which is combined with signal A, and with a signal $\phi_{-1}$ in gates 784, to alternately produce drive input pulses $P_B$ and $P_A$. These pulses have a very low duty cycle of 7.8 milliseconds, each have a period of 2 HZ, and are 180° apart in phase. Output drive pulses $Q_A$ and $Q_B$ are thereby produced from output amplifiers 785 and 786 respectively.

The stepping motor used with the present embodiment of an integrated circuit chip is of a type which is actuated by applying successive pulses which cause current of opposite direction to flow in the drive coil of the motor. In other words, to cause the motor to rotate, first a pulse $Q_A$ must be applied to one end of the drive coil, then a pulse $Q_B$ applied to the opposite end of the drive coil, and so on. If two pulses are applied in succession to the same end of the drive coil, then the motor will not step in response to the second of these pulses. When the standard frequency oscillator circuit and associated frequency dividers are released from the reset state, into which they may be placed in order to perform zero setting of the seconds hand of the timepiece or to reduce power consumption while the timepiece is being stored with the battery inserted, then it is possible for an error of one second to occur, for the reason explained above, when the reset condition is released. It is therefore necessary to store the phase condition of the drive pulses in a memory circuit, which is done by means of a flip-flop 783. The output signals of flip-flop 783, namely $\phi_{-1}$ and $\overline{\phi}_{-1}$ serve to control the phase of drive input pulses $P_B$ and $P_A$ during normal operation of the timepiece. While the standard frequency oscillator section is in the reset state, the phase of the drive signals immediately preceding the reset state being entered is memorized by flip-flop 783, so that when the reset state is released, the next drive pulse to be output, either $Q_A$ or $Q_B$, will be the appropriate pulse to cause the stepping motor of the timepiece to advance, causing the seconds hand of the timepiece to be advanced by one second. The waveform diagrams of FIGS. 8A, 8B, 8C and 8D show the waveforms which appear in the circuit of FIGS. 7A to 7D during the first two seconds after the reset condition referred to above has been released. For the case shown in FIGS. 8A to 8D, signal $\phi_{-1}$ is at the low logic level immediately following release of the reset condition, causing drive signal $P_A$ to be produced during the first one second after release of reset (although this is not shown in FIGS. 8A to 8D). During the second one second interval after release of reset, signal $\phi_{-1}$ is at the high logic level, so that drive signal $P_B$ is produced during this time interval, as shown in FIG. 8D.

In order to further reduce the power consumption, ring oscillator 791 is now allowed to oscillate continuously, but is controlled by a signal D applied to a NAND gate 800 within the oscillator loop, so that oscillation only occurs as a short burst, i.e., for 62.5 milliseconds period, once per second. This is designated as signal $P_{osc}$. In order to ensure that the oscillation frequency has stabilized before counting is performed by counter 799, the burst of oscillation signal $P_{osc}$ is gated through gates 794 under the control of a short duration pulse $\bar{E}$ which is produced during the last part of each $P_{osc}$ signal burst. Finally, to ensure that the oscillation signal is only counted for 7.8 milliseconds period during the one second periods in which the battery voltage is applied directly to supply ring oscillator 791, gating is performed in AND gate 810 by signal $\phi_{-1}$ through an inverting input to gate 810. Thus, during the one second intervals in which the stabilized voltage $V_{ss2}$ is being applied from the output of switching transistors 759 and 760, i.e. while temperature sensing is taking place, gate 810 is inhibited from passing a signal to counter circuit 799.

A bias can be applied to the count of counter 799, for adjustment purposes, by means of signals $g_1$ and $g_3$, which can be supplied through gates 794 separately or in combination, as determined by the settings of external switch connections coupled to control terminals 715 and 717. The relationship between the settings of control terminals 715 and 717 and the number of pulses to be corrected is indicated in the following table:

TABLE

| | VR1 | | |
|---|---|---|---|
| VR3 | L | — | H |
| L | 8 | 7 | 6 |
| — | 5 | 4 | 3 |
| H | 2 | 1 | 0 |

where

VR1 = control terminal 715

VR3 = control terminal 717

L = low logic level

H = high logic level

— = open state

The content of counter 799 is refreshed once in every two seconds in response to tuning signals $\overline{\phi_{-}}$ and $\phi_0\downarrow$.

Voltage stabilizer 750 differs from the voltage stabilizers previously described, such as that of FIG. 2, in that current mirror stages are used in order to cascade a series of current regulating stages, in order to achieve a high degree of stabilization. Current mirror stages have the advantage of being suitable for use with a very low level of supply voltage, and are thus preferable for use with certain types of batteries. A voltage developed across constant voltage diode-connected transistors 735 and 736, which are connected in series with resistors 736, which are connected in series with resistors 736 and 737, is applied to the gate of transistor 740, which has a high value resistor connected in its drain lead. The drain current of transistor 740 is applied to transistor 741 of a current mirror stage. Transistors 741 and 742 have very similar electrical characteristics, so that since the gate-to-drain voltage of each is identical, a virtually identical drain current will flow in each of them. Transistor 742 therefore behaves as a current source of extremely high impedance. The drain current of transistor 742 is passed through series-connected transistors 743 and 744, connected as constant voltage diodes, and the voltage developed across these transistors is applied to the gate of a transistor 745. Transistor 745 has a current-defining resistor 746 connected in its drain lead, and the drain current of this transistor is applied to a second current mirror stage consisting of transistor pair 747. The constant current of this current mirror stage passes through series-connected transistors 752, and the voltage developed thereby is applied to the gate of transistor 754. A trimmable resistor 756 is connected in the drain lead of transistor 754, which can be adjusted to set the output stabilized voltage of the circuit to a desired value.

The drain current of transistor 754 is passed through another current mirror state 748, and the regulated current from this stage is passed through series-connected transistors 749, connected as constant voltage diodes. The voltage across these transistors is applied to the gate of a transistor 751, which in conjunction with transistors 757, 751, 725, 774 and 776 forms a differential amplifier. The output voltage of this amplifier is applied to the gate of transistor 765, and is back (as negative feedback) to the gate of transistor 757 for comparison with the stabilized voltage appearing at the gate of transistor 751, which serves as a reference voltage. A stabilized voltage $V_{ss2}$ is thereby developed, and supplied to oscillator circuit 702. A stabilized voltage of lower value than $V_{ss2}$, namely $V_{ss3}$, is derived from $V_{ss2}$ by amplifier 758, and is supplied to frequency divider circuits 704, 706, 708 and 710, as well as to flip-flops 722 and 723 and to gates 720 and 724. Signals $\phi_{-1}$ and $\overline{\phi_{-1}}$ applied to the gates of transistors 759 and 760 respectively cause an output voltage $V_{ss4}$ to be produced, which is alternately equal to the battery voltage $V_{ss1}$ during a one second time interval, then equal to the value of stabilized voltage $V_{ss2}$ during a succeeding one second time interval, then back to $V_{ss1}$ for one second, and so on. Voltage $V_{ss4}$ is supplied to a ring oscillator circuit 791, so that this circuit can serve to sense both the level of battery voltage and the operating temperature, as described previously.

Figure 8A:
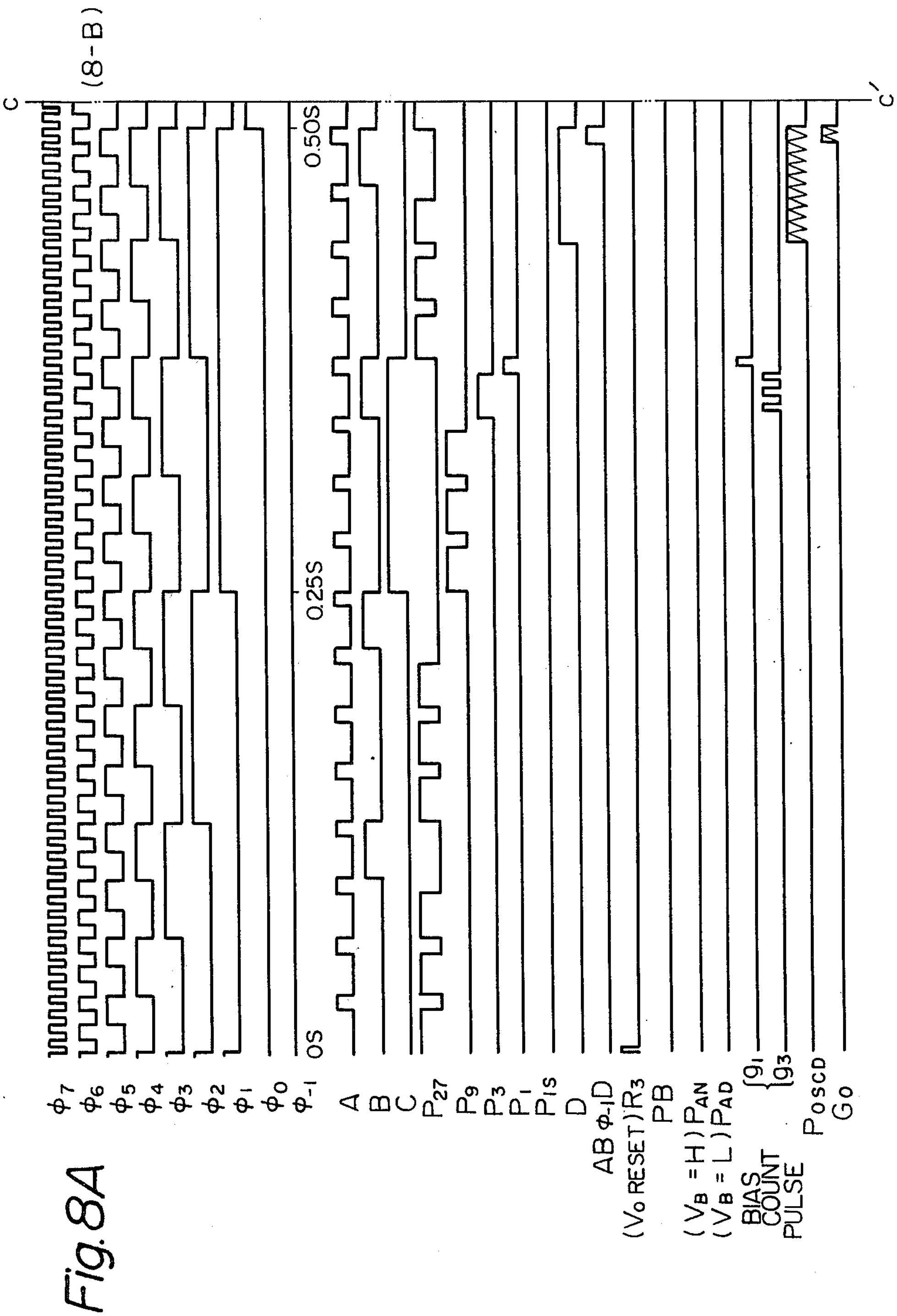
Figure 8B:
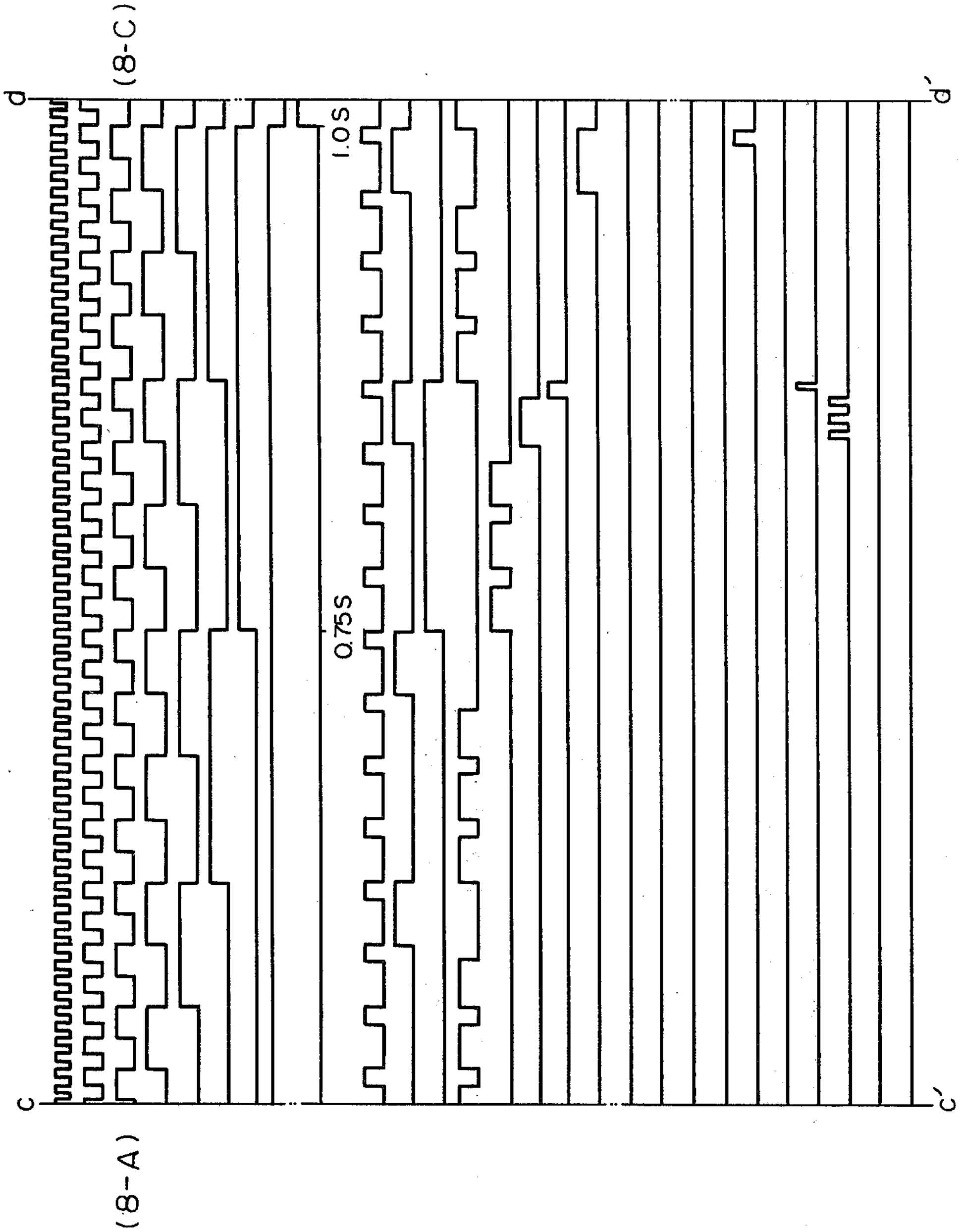
Figure 8C:
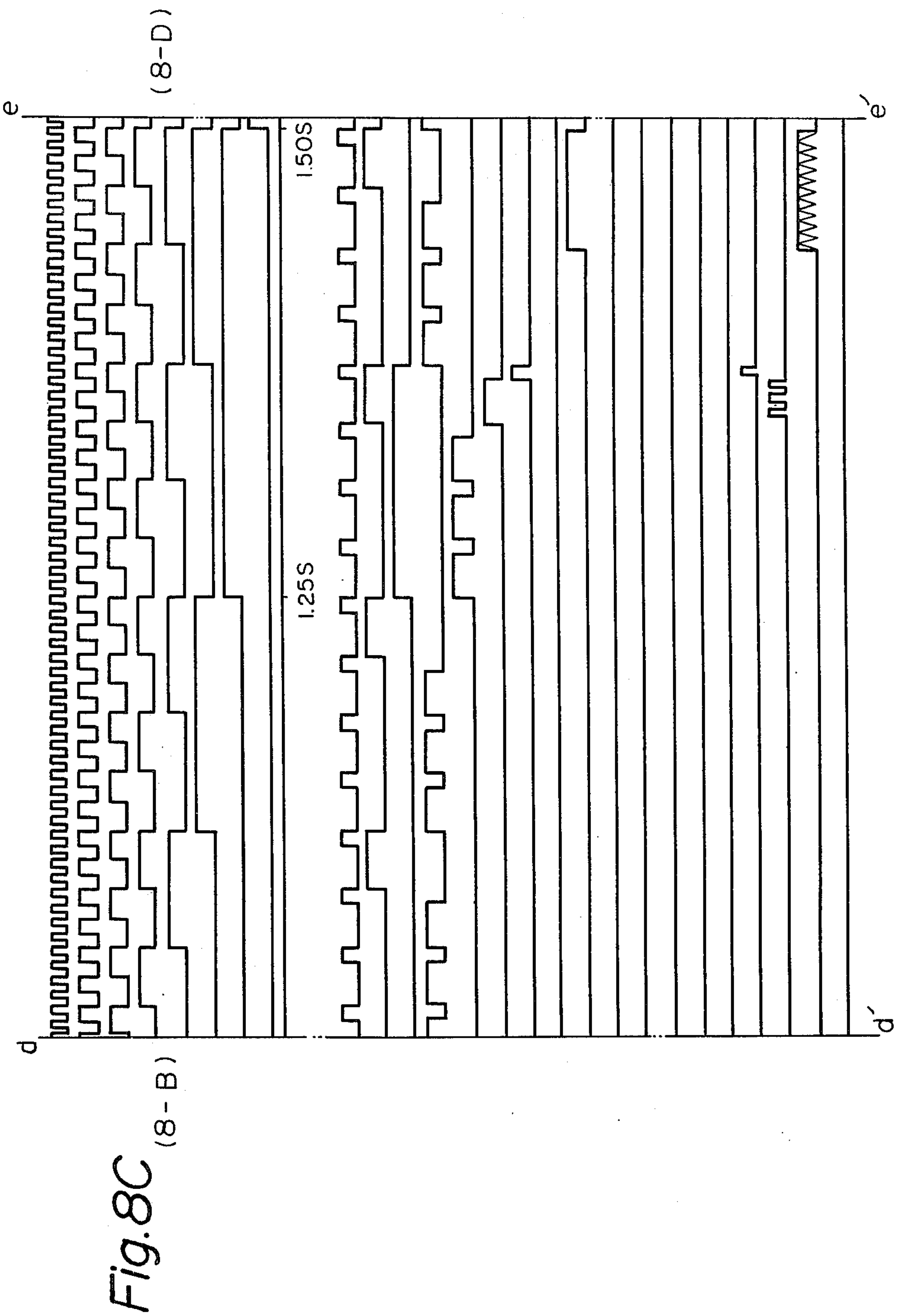
Figure 8E:
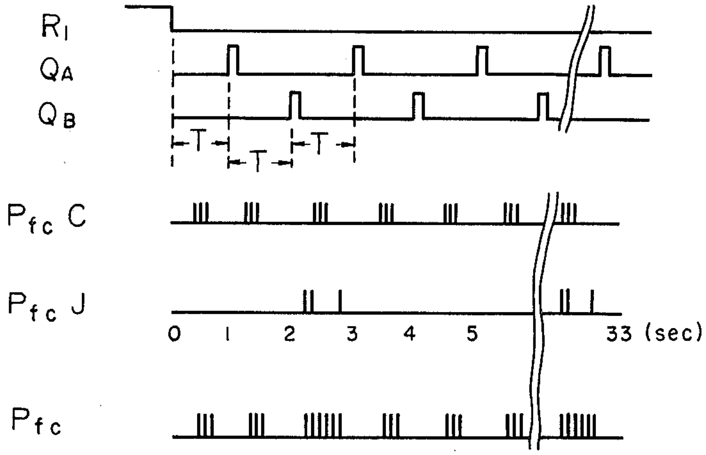

The method by which correction signal Pfc is generated will now be described. Signal $\phi_0$ is a square-wave signal with a period of one second. Flip-flop 761, in conjunction with gates 762 and 763, serves to produce narrow-width pulses $\phi_0\uparrow$ and $\phi_0\downarrow$ on the leading and trailing edges of signal $\phi_0$ respectively. These narrow width pulses are produced at timings which are precisely determined by signal $\phi_{12}$ applied to the clock terminal of flip-flop 761, this signal being the output of the final stage of frequency divider 710, after level shifting, which appears at the output of gate 729. Signals $\phi_0\uparrow$ and $\phi_0\downarrow$ are applied to the set and reset terminals of a group of set/reset flip-flops (referred to hereinafter af FFs), a typical one of which is designated by the numeral 766, and which have the circuit shown by numeral 796. If, for example, terminal 797 should be set to the low potential logic level of the circuit (the L level), then the Q output terminal of FF 766 will be held at the L level. If terminal 797 is connected to the high potential logic level of the circuit, (the H level) then output Q of FF 766 will be held at the H level. If, however, terminal 797 is left in a floating condition, then the Q output of FF 766 will be set to the H level by each $\phi\uparrow$ pulse, and reset to the L level by the succeeding $\phi\downarrow$ pulse, so that a square wave signal with identical frequency to signal $\phi_0$ but with phase determined by $\phi_{12}$ will appear at the Q output of FF 766. The output of each flip-flop such as 766 is applied to one input of an exclusive-OR gate such as 795, the internal circuit of which is shown indicated by the numeral 767. Signal $\phi_0$ is applied to the other input terminal of the exclusive-OR gate. As a result, the output of the exclusive-OR gate will be a square wave signal of period one second, the phase of which will differ by 180° in accordance with whether the corresponding input control terminal (such as terminal 797) is set to the H level or the L level. In the case of the coarse control section, these square wave signals are applied to a set of AND gates with their outputs connected to a common OR gate, designated by numeral 801. Signals P27, P9, P3 and P1, which have the waveforms shown in FIGS. 8A, 8B, 8C and 8D, are applied to the other input terminals of the AND gates of 801. The output of the common OR gate is applied to an input of a NAND gate 803, and is combined in this gate with signals $\phi_8$ and $\phi_7$, to produce signal $\overline{P}$c. It will be apparent that the number of logic level transitions of signal Pc occurring per second will depend upon which of the weighted input terminals JC27 to JC1 have been connected to the H or the L level, and that the phase of these logic level transitions will be determined by whether the respective terminals have been connected to the H level or to the L level. Namely, when the weighted input terminals JC27 to JC1 are connected to the H or the L level, the time interval T for which the drive signals $Q_A$ and $Q_B$ are generated will finely vary because the burst of signal PfcC (see FIG. 8E) is produced when the input terminals JC27 to JC1 are controlled. When the input terminals Jf27 to Jf1 are connected to the H or the L level, the burst of signal Pfc is produced as shown in FIG. 8E once in every 30 seconds 2 seconds after the reset state has been released. Thus, the time interval T at which the drive signals $Q_A$ and $Q_B$ are produced will vary.

The timekeeping rate of the timepiece may also be finely adjusted to an increased or a decreased level by a differentiated pulse of an input signal produced by the input terminal Jf1. This differentiated pulse may further be used for temperature compensation by using an IC chip of an option system.

The phase assignment of the frequency adjustment signals is expressed below with reference to related inputs and corresponding adjustment of timekeeping rate:

| Phase assignment signals | Inputs | Timekeeping |
|---|---|---|
| $\phi_8\phi_7\overline{\phi}_0 = 1$ | by option system | Increased |
| $\phi_8\overline{\phi}_7\overline{\phi}_0 = 1$ | by Jf1–Jf27 | Increased |
| $\overline{\phi}_8\overline{\phi}_7\overline{\phi}_0 = 1$ | by Jc1–Jc27 | Increased |
| $\phi_8\phi_7\phi_0 = 1$ | by option system | Decreased |
| $\phi_8\overline{\phi}_7\phi_0 = 1$ | by Jf1–Jf27 | Decreased |
| $\overline{\phi}_8\overline{\phi}_7\phi_0 = 1$ | by Jc1–Jc27 | Decreased |

The above phase assignment is made view a view to making it possible to independently controls of timekeeping rate.

The weighted signals $P_1$ to $P_{27}$ are produced to be out of phase with drive signals as indicated below:

$$P_1 = ABC = \phi_1\overline{\phi_2}\phi_3\phi_4\phi\phi_6$$

$$P_3 = AB\overline{C} = \phi_1\phi_2\phi_3\ \phi_4(\overline{\phi_5\phi_6})$$

$$P_9 = A\overline{BC} = \phi_1\overline{\phi_2}(\overline{\phi_3\phi_4})(\overline{\phi_5\phi_6})$$

$$P_{27} = \overline{ABC} = \overline{\phi_1\phi_2}(\overline{\phi_3\phi_4})(\overline{\phi_5\phi_6})$$

The weighted signal $P_1$ to $P_{27}$ are combined with the phase assignment signals to provide the frequency adjustment signal Pfc.

Counter circuit 771, in conjunction with gates 772 and 773, serves to generate a signal $P_{02s}$, which gates the output of AND gates and OR gate 802 of the fine control section through NAND gate 804. Signal $P_{02s}$ has a duration of one second, and occurs once in every 30 seconds, beginning two seconds after counter 771 has been reset by signal R4. During this one second interval, output signal $\overline{P}$f from NAND gate 804 appears, and is applied to the input of NOR gate 807. Thus, a signal $P_{FCD}$ appears at the output of AND gate 808, comprising a burst of pulses occurring during one second in every 30 seconds, if one or more of the fine frequency control input terminals JF27, JF9, JF3 or JF1 has been connected to either the H level or the L level.

Signal $P_{FCD}$ is applied to the data terminals of a data-type flip-flop 809, to the clock terminal of which the signal $\phi_{12}$* is applied. The latter signal is obtained by caking the exclusive-OR of signals $\phi_0$ and $\overline{\phi_{12}}$. Correction signal Pfe is thereby generated from the output of FF 809.

Figure 8F:
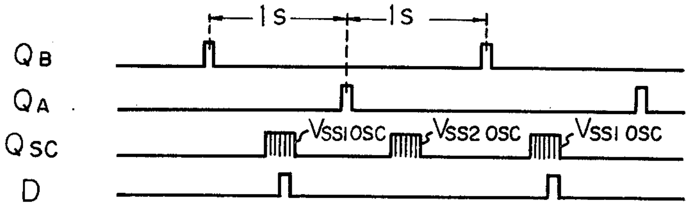

The output signal from ring oscillator 791 is passed through a level shifter 792, and through an initial stage of frequency division in divider 806, and comprises a short burst of pulses Osc (see FIG. 8F) occurring once per second at the timing of gating pulse D. The oscillator 791 oscillates for an interval of about 0.5 seconds after each drive signals $Q_B$ is produced, with the oscillation frequency depending upon the battery voltage whereby the battery voltage is detected. The oscillator 791 is supplied with a stabilized voltage $V_{SS2}$ to oscillator for an interval of about 0.5 seconds after each drive signal $Q_A$ is produced, with the oscillation frequency representing temperature information having no voltage coefficient. Thus, it will be apparent that the oscillator 791 provides both functions of battery voltage detection and the ambient temperature detection. These bursts of pulses are passed from gates 793 to gates 794, and are furhter controlled by gating pulses $g_1$ and $g_3$, before being passed through AND gate 810. Signal $\phi_{-1}$ controls AND gate 810 so that oscillator pulses are only output from this gate during periods when the battery voltage is being applied to oscillator 791, i.e. during periods when the battery voltage level is being sensed. The output of AND gate 810 is applied to a counter 799 which is reset onece every two seconds by the output of a NAND gate 811. If the frequency of ring oscillator 791 falls below a certain value during the intervals when the battery voltage is supplied to it, then the Q output of the final stage of counter 799 will remain at the L level (i.e. in the reset state) at a timing which will cause a detection signal $P_{AD}$ to be produced by AND gate 812 (in FIG. 7B). As a result, a drive pulse will be produced as $P_A$, just before the next drive pulse $P_B$ due to signal $\overline{V}_{BL}$ being at the L level. The L level of signal $\overline{V}_{BL}$ inhibits the normal $P_{AN}$ pulse from being output by AND gate 819. This causes the seconds hand of the timepiece to be driven at a rate of two immediately consecutive steps, once every two seconds. This indicates that the battery voltage is below a predetermined level.

The output signal from oscillator 791 is also available from the output of an AND gate 813, during periods when ring oscillator 791 is being driven by the stabilized voltage $V_{ss2}$. This signal therefore provides temperature information, which can be used to compensate the timepiece for gain/loss due to the effects of temperature upon the quartz crystal vibrator. The level shifted output of frequency divider 710 is available at terminal 728, during normal operation of the timepiece.

Signals R1 and R2, generated by externally switching terminal 768 and 780 to the H level, are employed for such purposes as testing and adjustment. If R1 alone is set to the H level, then an output signal from NAND gate 650 causes the gate circuits 816 and 817 to reset the seconds hand. If R1 is connected via a resistor to a voltage potential slightly higher than $V_{SS1}$, it is possible to observe the correction signal $P_{FC}$. If R2 alone is set to be H level, then the output of level shifter 726 is inhibited from passing through gates 727 and 729, so that an external test signal of 2048 Hz can be input to frequency divider 781. If both test terminal 728 and reset terminal R2 are set to $V_{SS1}$, the voltage stabilizing circuit can be short-circuited. If the test terminal 728 is grounded via a capacitor of $10^{-3}$F and R2 is set to $V_{SS1}$, then the output characteristics such as impedance or noise can be improved. If both R1 and R2 are set to the H level, then test signals can be applied to input terminals JF9 and JF3, which are output from gates 816 and 817 respectively as $M_B$ and $M_A$ signals. These result in corresponding drive output signals being produced from drive amplifiers 786 and 785, so that the time indicating hands can be driven at some arbitrary rate, for testing or for setting to a predetermined position.

Figure 7D:
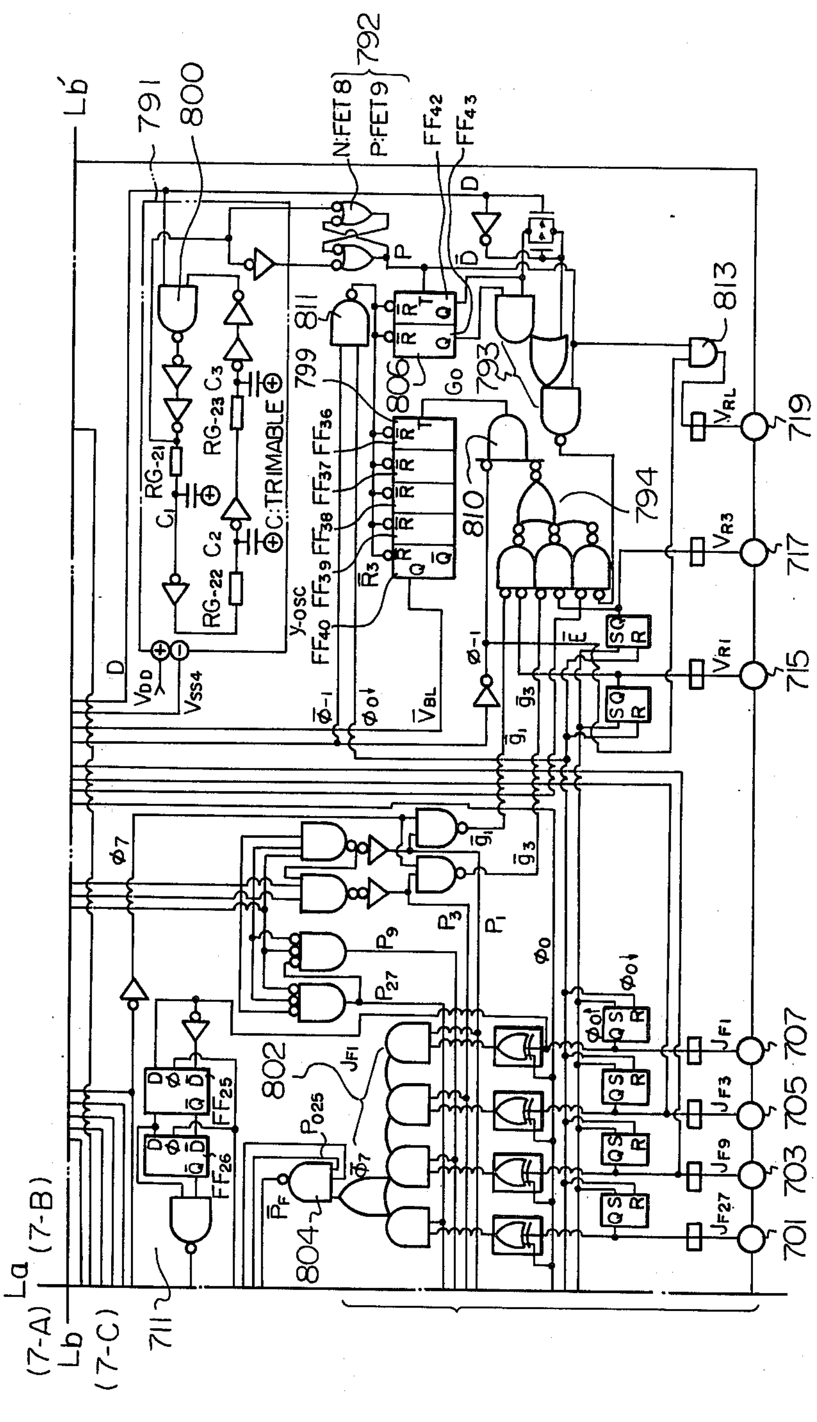
Figure 7E:
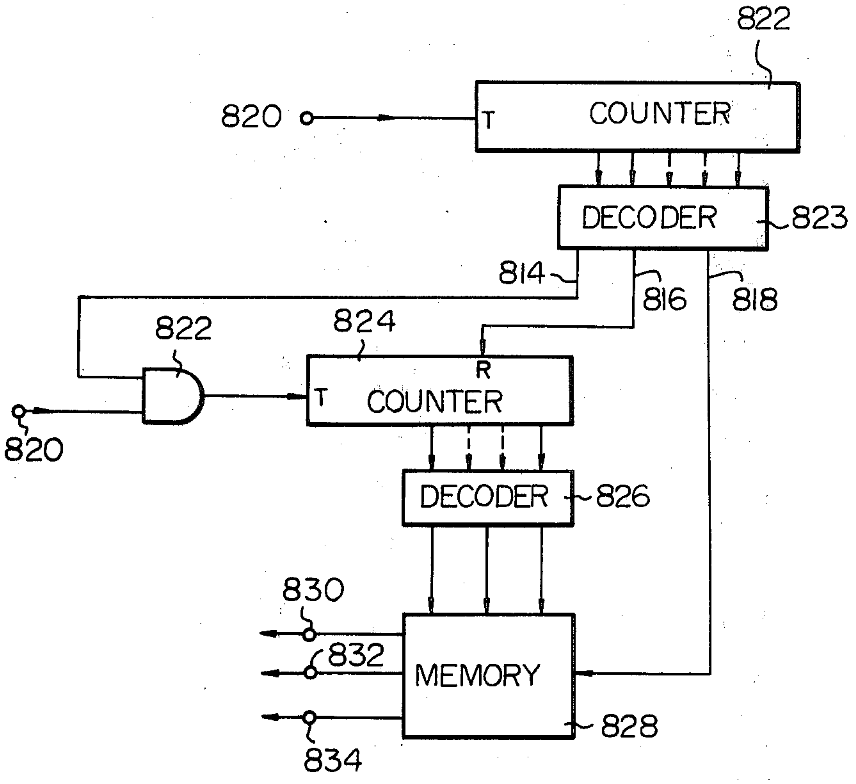
FIG. 7E is a block diagram of a circuit arrangement adapted to provide temperature compensation of timekeeping gain/loss.

The output signal of ring oscillator 791 can be utilized to provide temperature compensation of timekeeping gain/loss by connecting the integrated circuit chip whose circuit is shown in FIGS. 7A to 7D to a temperature compensation control integrated circuit chip in a manner as disclosed in U.S. Pat. No. 4,094,137. An example of such an integrated circuit is shown in block diagram form in FIG. 7E. In FIG. 7E, terminal 820 is connected to terminal 728 of FIG. 7A, to receive the output signal from level shifter 726. This is input to a counter circuit 822, outputs of which are applied to a decoder 823, to provide various control signals. Control signal 814 of decoder 823 allows pulses appearing at terminal 820, which is connected to terminal 719 in FIG. 7D to receive the output of ring oscillator 791 during temperature sensing time intervals, to pass through AND gate 822 for predetermined time intervals. At the end of each of these time intervals, during which the output of AND gate 822 is counted by a counter 824, the count value of counter 834 is decoded by decoder 826, and the decoded value is stored in a memory circuit 828 in response to control signal 818. Counter circuit 824 is then reset, and another such cycle can begin again. Decoder 826 and memory circuit 828 are so arranged that if the count value of counter 824 remains at a certain value, corresponding to a certain reference operating temperature, then the outputs 830, 832 and 834 remain in a floating condition. If the count value of counter 824 falls below this reference value, then output 830 will go to the H level. If the count value falls further, then output 832 will go to the H level and 830 returns to the floating state, and if the count of 824 further decreases, then both 830 and 832 will go to the H level. In other words, 830, 832 and 834 are weighted. Output 830 is connected to control terminal 707 in FIG. 7D, 832 is connected to terminal 705, while terminal 834 is connected to control terminal 703, i.e. terminals 830 to 834 are connected to the lower order fine frequency control terminals of the circuit in FIG. 7A to 7D. Compensation is thus applied for variations in operating temperature. If the count of counter 824 should rise above the reference value, then one or more of terminals 830 to 834 in FIG. 7E be set to the L level, so that compensation is applied in the opposite direction, i.e. a lowering of the running rate of the timepiece is caused.

Figure 9A:
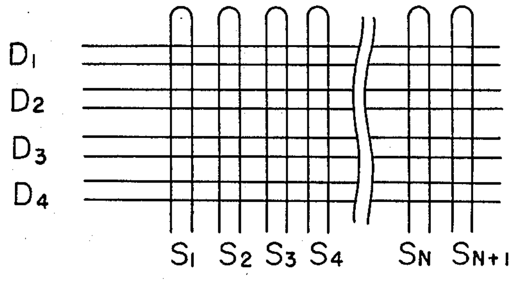
FIG. 9A is a schematic view of an electro-optical display device having digit and segment electrodes arranged in a matrix configuration and FIG. 9B shows a part of the electro-optical display device.

FIG. 9A shows an example of a liquid crystal display device having digit and segment electrodes arranged in a matrix configuration. $D_1-D_4$ and $S_1-S_{N+1}$ in FIG. 9A indicate digit electrodes and segment electrodes, respectively. To turn on an arbitrary display segment $S_{ij}$ (i=1, 2, 3, 4; j=1, 2, ... N+1) at the intersection of the digit and segment electrodes, the root mean square voltage to be applied across the digit and segment electrodes should be larger than the threshold voltage $V_{TLC}$ for exiciting the liquid crystal. To render the display segment $S_{ij}$ to turn off, the root mean square voltage to be applied across the digit and segment electrodes should be smaller than the threshold voltage $V_{TLC}$. The threshold voltage $V_{TLC}$ of the liquid crystal increases with the decrease in ambient temperature. To maintain a high contrast of the display segment, the drive voltage must be increased to a higher level at a low ambient temperature. FIG. 9M represents the relationship between the threshold voltage $V_{TLC}$ and the temperature ($\theta$) whereas FIG. 9N shows the relationship between the drive voltage $V_{LC}$ and display contrast C.

Figure 9B:
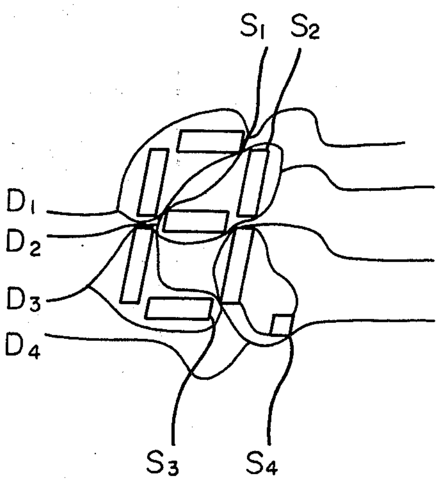

FIG. 9B illustrates the arrangement of electrodes which constitute a one-letter alphanumeric display element having seven display segments.

Figure 9C:
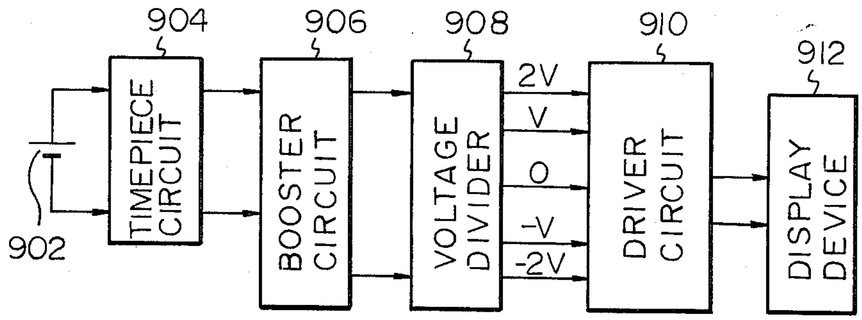
FIG. 9C is a simplified block diagram of an electronic timepiece incorporating the electro-optical display device shown in FIGS. 9A and 9B.
Figure 9D:
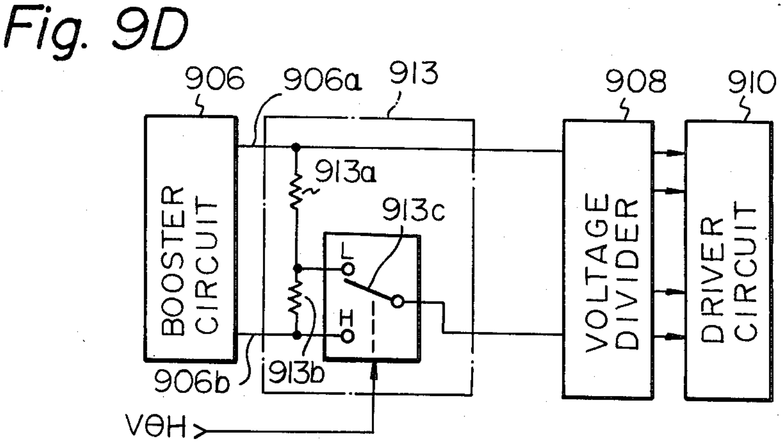
FIG. 9D is an example of a block diagram of a circuit arrangement adapted to provide temperature compensation of a display contrast of the electro-optical display device.
Figure 9E:
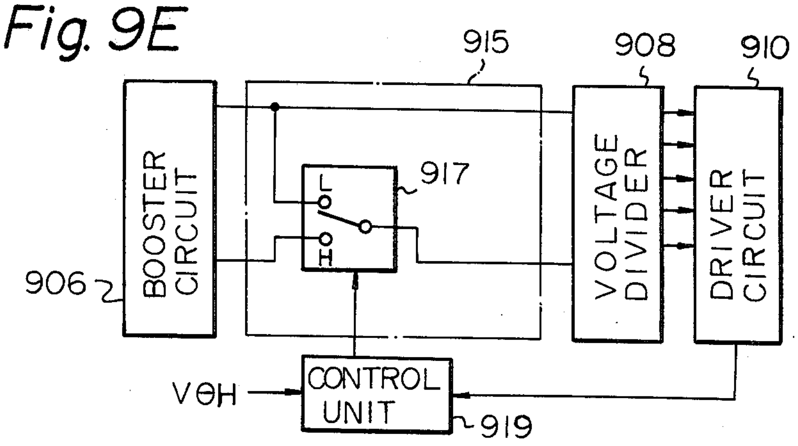
FIGS. 9E–9G show various modifications of the circuit shown in FIG. 9D.
Figure 9F:
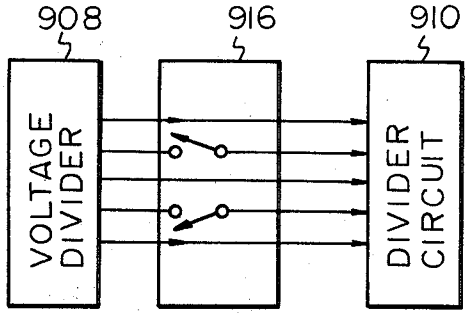
Figure 9G:
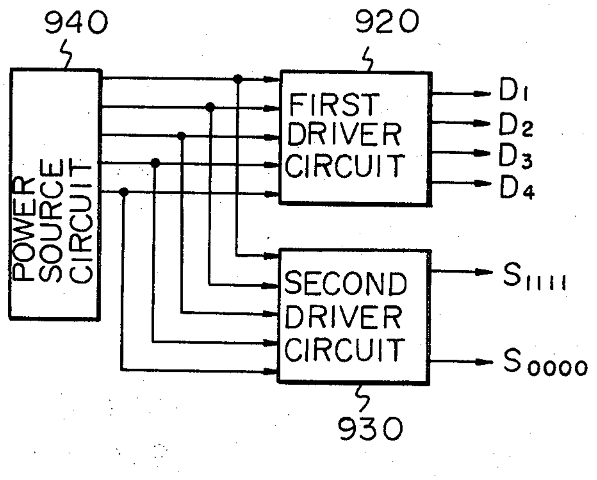

Shown in FIG. 9C is a block diagram of a timepiece including a liquid crystal display drive circuit. Denoted by numeral 902 is a power cell, 904 a timepiece circuit, 906 a booster circuit, 908 a voltage divider, 910 a driver circuit, and 912 a display device. As already mentioned, the voltage divider 908 may comprise the combination of a capacitor and a field effect transistor or a resistor.

Figure 9H:
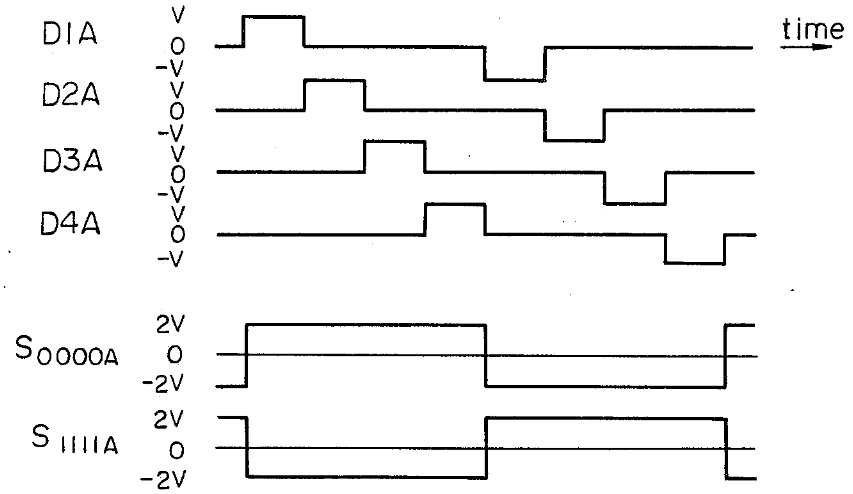
FIGS. 9H–9L show waveform diagrams of digit and segment drive signals.

FIG. 9H shows a waveform diagram of digit drive signals and segment drive signals produced by the driver circuit 912 of FIG. 9C. $S_{0000}$ and $S_{1111}$ indicate segment drive signals and $D_1$-$D_4$ denote the digit drive signals. When $S_i=S_{0000}$, all the display segments at the intersections of the $S_i$ segment electrode and digit electrodes $D_1$-$D_4$ remain OFF or non-display state. When $S_i=S_{1111}$, all the display segments at the same intersections are turned ON. Thus, the segment drive signal $S_i$ can selectively designate 16 different states (on/off) of the display segments located at the four intersections of the segment electrode $S_i$ and digit electrode $D_1-D_4$.

Figure 9I:
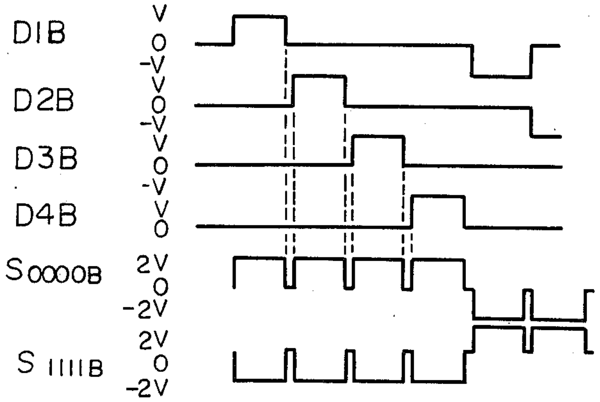
Figure 9J:
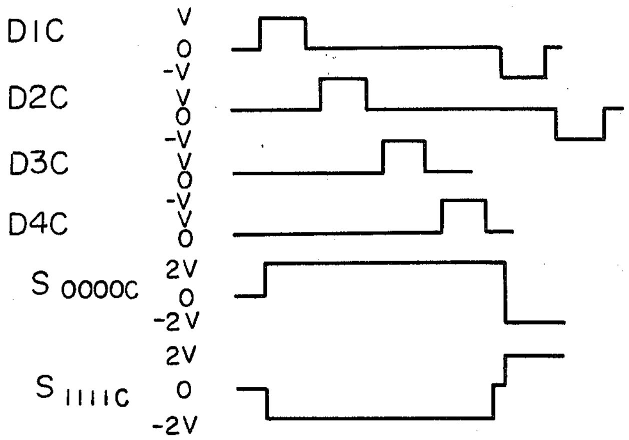

To lower both of the ON voltage $V_{ON}$ and OFF voltage $V_{OFF}$, the digit drive signals $D_1$-$D_4$ and segment drive signals $S_1$-$S_4$ will be kept at low voltage for a given phase as indicated in FIG. 9I. FIG. 9J shows a waveform diagram in which only digit drive signals $D_1$–$D_4$ are modulated.

Figure 9K:
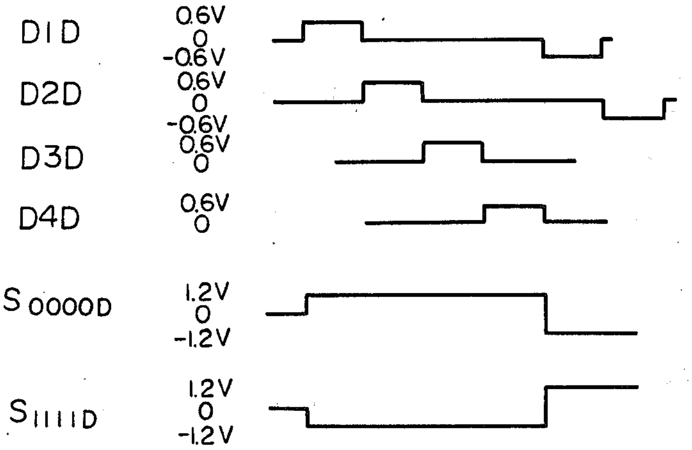
Figure 9L:
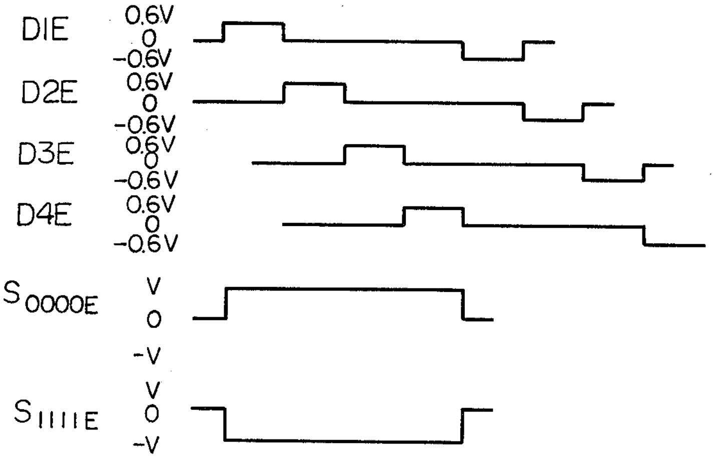
Figure 9M:
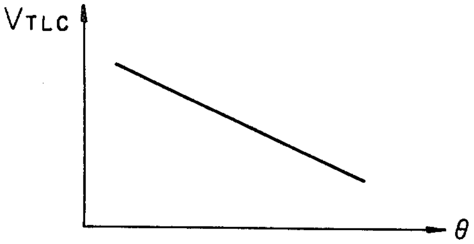
FIGS. 9M and 9N are graphs illustrating the characteristics of the liquid crystal display device.
Figure 9N:
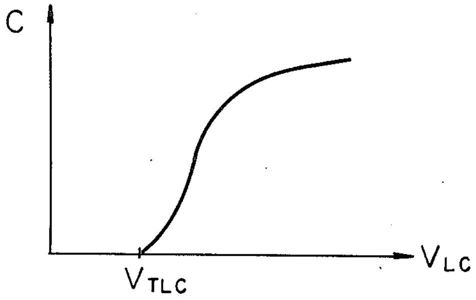

FIG. 9K shows a waveform diagram wherein the voltage potential of both of the digit and segment drive signals is lowered. Such voltage drops indicated in FIGS. 9I and 9K are obtainable by modulating the power source circuit in dependence on temperature information.

The modulation of D signal or S signal alone in dependence on temperature as in FIGS. 9J and 9K can be made by the driver circuit. Usually, the modulated digit drive signals $D_1$–$D_4$ can be produced by a driver circuit having a large driving capacity whereas the modulated segment drive signals $S_1$–$S_{N+1}$ can be produced by a driver circuit having a relatively small driving capacity. The source voltage can practically be modulated by a small number of modulator elements.

FIG. 9D shows an example of a circuit diagram arranged to modulate the digit and segment drive signals to be applied to the digit and segment electrodes, with the timepiece circuit and the display device being omitted herein for the sake of simplicity of illustration and the same component bearing the same reference numerals as those used in FIG. 9C. In FIG. 9D, a modulation circuit 913 is provided between the booster circuit 906 and a voltage converter or voltage division circuit 908. The modulation circuit 913 comprises a first resistor 913*a* and a second resistor 913*b* connected in series across the output lines 906*a* and 906*b* of the booster circuit 906. A switch means 913*c* is provided and responsive to a temperature information signal $V\phi H$ delivered from a temperature detection circuit previously described. The switch means 913*c* is opened or closed in dependence on the temperature information signal so that the amplitude of the digit and segment drive signals produced by the driver circuit 910 will have an optimum level to provide a high display contrast.

FIG. 9E shows another example of a circuit diagram arranged to modulate the digit and segment drive signals, with like parts bearing the same reference numerals as those used in FIG. 9D. In FIG. 9E, a modulation circuit 915 comprises a switch means 917 and a control unit 919 responsive to the temperature information signal $V\phi H$ and output signals from the driver circuit 910 to control the actuation of the switch means 917 by which the pulse width of each of the digit and segment drive signals can be modulated in a manner as shown in FIGS. 9I and 9J.

FIG. 9F shows another example of a circuit diagram arranged to provide modulated digit and segment drive signals in dependence on the temperature information. In FIG. 9F, a modulation circuit 916 is provided between the voltage conversion circuit 908 and the driver circuit 910, to switch the connecting state between the power source circuit and the driver circuit 910 in dependence on the temperature information.

FIG. 9G shows still another example of a circuit diagram including a power source circuit 940, and first and second driver circuit 920 and 930 connected to the power source circuit 940. In this circuit arrangement, the first driver circuit provides digit drive signals, and the second driver circuit 930 provides segment drive signals. The segment drive signals have a voltage potential different from that of the digit drive signals. FIG. 9J shows a waveform diagram of digit drive signals each of which varies between potentials V and 0 and segment drive signals each of which varies between potentials 2V and 0. Switching circuits 913C, 917 and 916 of the driver systems shown in FIGS. 9D–9G can be operated by field effect transistors.

Turning back to FIG. 9D, temperature elevation is detected by a circuit similar to those 793 and 794 previously described with reference to FIG. 7D. Pulse signal drawn out through terminal 719 of FIG. 7D is prepared in a way similar to $\overline{V_{BL}}$ by a frequency detector similar to the above-mentioned, to provide a temperature information signal $V\theta H$. This pulse signal $V_{\theta H}$ actuates switch 913C to the lower voltage side L.

In FIG. 9E, a control unit or modulation drive circuit 919 is installed which in response to signal $V_{\theta H}$ actuates a switch 917 to assume the position L for a given phase and the position H for the other phase, in synchronism with the outputs of driver circuit 910. By the circuits 917 and 919, the divided input voltage is modulated as indicated in FIG. 9I in synchronism with the outputs from the driver circuit 910.

Figure 10A:
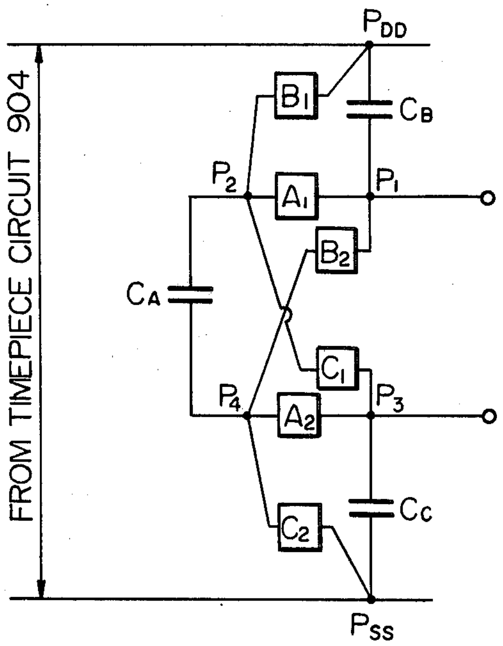
FIG. 10A is a circuit diagram of a voltage conversion circuit shown in FIGS. 9C–9F, FIGS. 10B–10G show various examples of the switching elements shown in FIG. 10A.
Figure 10B:
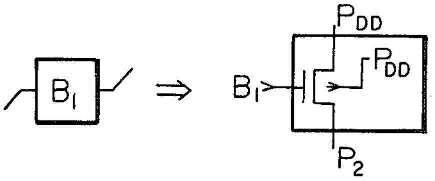
FIG. 10H is a waveform diagram of various signals used in the circuit of FIG. 10A.
Figure 10C:
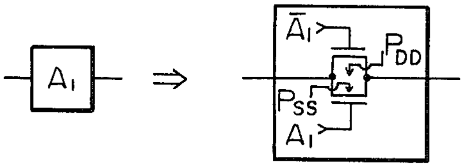
Figure 10D:
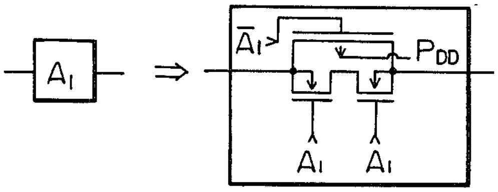
Figure 10E:
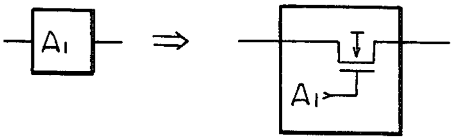
Figure 10F:
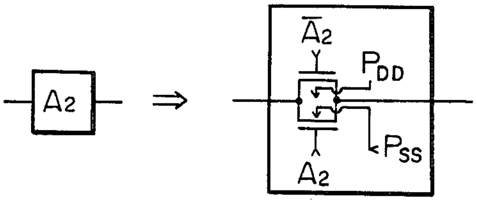
Figure 10G:
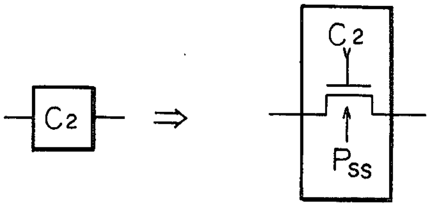

FIG. 10A illustrates an example of the voltage converter 908 mentioned above. Waveforms of FIG. 10H represent the output signals generated by the converter 908.

Referring to FIG. 10A, is a first phase switches $A_1$ and $A_2$ are turned on and switches $B_1$, $B_2$, $C_1$ and $C_2$ are turned off so that capacitors $C_B$, $C_A$ and $C_C$ are connected in series to be charged. In a second phase, switches $B_1$ and $B_2$ are turned on to establish parallel connection of two capacitors $C_A$ and $C_B$ whereby the potential differences are commonly averaged. In the meantime, switches $A_1$, $A_2$, $C_1$ and $C_2$ are made nonconductive. In a third phase, switches $A_1$ and $A_2$ are rendered conductive so that the capacitors $C_A$, $C_B$ and $C_C$ are coupled in series. Switches $B_1$, $B_2$, $C_1$ and $C_2$ re turned off. In a fourth phase, switches $C_1$ and $C_2$ are turned on coupling the capacitor $C_A$ in parallel with the capacitor $C_B$ and, therefore, the potential difference of each capacitor is averaged commonly with others and the switches $B_1$, $B_2$, $A_1$ and $A_2$ are turned off.

The above procedures are repeated until a voltage $\frac{1}{3}(V_{DD}-V_{SS})$ appears commonly across $P_{DD}$, $P_1$, $P_3$ and $P_{SS}$. Thus, the divided voltage constantly appears at the terminals $P_1$ and $P_3$. Though the omission of the third phase is not objectionable, the third phase should preferably exist to balance the potential difference between $P_{DD}$ and $P_1$ and that between $P_3$ and $P_{SS}$.

Figure 10H:
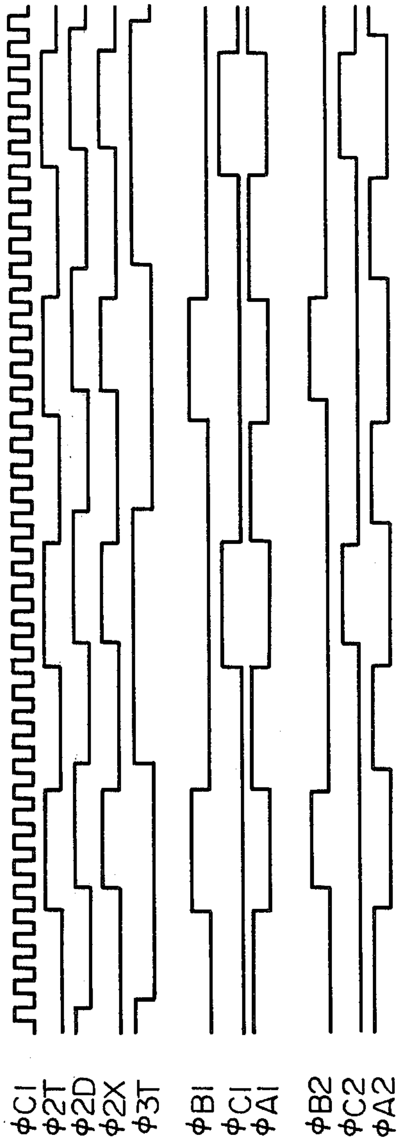

Waveforms of FIG. 10H present a method of preparing a signal $\phi_{A1}$ which determines the first and third phase, a signal $\phi_{B1}$ for determining the second phase and a signal $\phi_{C1}$ for determining the fourth phase. Waveforms $\phi_{B2}$, $\phi_{C2}$ and $\phi_{A2}$ indicate signals corresponding to the signals $\phi_{B1}$, $\phi_{C1}$ and $\phi_{A1}$ and appearing when the phase rendering all the switches $A_1$–$C_2$ off is set. Switches shown in FIG. 10A are turned on at high levels of the signals $\phi_{A1}$–$\phi_{C1}$.

FIGS. 10B–10G show an example of each of the switches $A_1$, $A_2$, $B_1$ and $C_2$ which comprise field effect transistors.

What is claimed is:

1. An electronic timepiece powered by a battery and having display means for indicating time, comprising an integrated circuit chip including a standard frequency signal source for generating a signal of relatively high frequency, frequency divider means responsive to said signal of relatively high frequency for producing a relatively low frequency signal, and drive signal generator means responsive to said relatively low frequency signal for producing drive signals, said integrated circuit chip also including reference voltage circuit means composed of current mirror circuit means to provide a stabilized current and a plurality of voltage stabilizer circuit means responsive to said stabilized current to provide a reference voltage, and constant voltage circuit means including a differential amplifier responsive to said reference voltage and source grounded driving transistor means connected to said differential amplifier to provide a constant voltage.

2. An electronic timepiece according to claim 1, wherein said source grounded driving transistor means includes gate and drain terminals, and a capacitor connected between said gate and drain terminals.

3. An electronic timepiece according to claims 1 or 2, wherein said differential amplifier includes field effect transistor means whose gate electrode is supplied with said reference voltage.

* * * * *